United States Patent
Lin et al.

(10) Patent No.: US 8,426,958 B2
(45) Date of Patent: Apr. 23, 2013

(54) STACKED CHIP PACKAGE WITH REDISTRIBUTION LINES

(75) Inventors: Mou-Shiung Lin, Hsinchu (TW);
 Shih-Hsiung Lin, Hsinchu (TW);
 Hsin-Jung Lo, Taipei County (TW);
 Ying-Chih Chen, Tainan County (TW);
 Chiu-Ming Chou, Kaohsiung (TW)

(73) Assignee: Megica Corporation, Hsinchu (TW)

( * ) Notice: Subject to any disclaimer, the term of this patent is extended or adjusted under 35 U.S.C. 154(b) by 0 days.

(21) Appl. No.: 13/159,368

(22) Filed: Jun. 13, 2011

(65) Prior Publication Data

US 2011/0241183 A1   Oct. 6, 2011

Related U.S. Application Data

(63) Continuation of application No. 12/269,045, filed on Nov. 12, 2008, now Pat. No. 7,973,401, which is a continuation of application No. 11/416,134, filed on May 3, 2006, now Pat. No. 7,508,059.

(30) Foreign Application Priority Data

May 3, 2005 (TW) .............................. 94114203 A

(51) Int. Cl.
 *H01L 23/02* (2006.01)
(52) U.S. Cl.
 USPC ........... 257/686; 257/777; 257/693; 257/698; 257/E25.006; 257/E25.021; 257/E25.027; 257/E23.085
(58) Field of Classification Search .................. 257/686, 257/685, 777, E25.006, E25.021, E25.027, 257/E23.085, 693, 698
See application file for complete search history.

(56) References Cited

U.S. PATENT DOCUMENTS

| | | | |
|---|---|---|---|
| 2,920,232 A | 1/1960 | Evans | |
| 3,504,214 A | 3/1970 | Lake et al. | |

(Continued)

FOREIGN PATENT DOCUMENTS

| | | |
|---|---|---|
| TW | 369690 | 9/1999 |
| TW | 523887 B | 3/2003 |

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Jasmine Clark
(74) *Attorney, Agent, or Firm* — Seyfarth Shaw LLP

(57) ABSTRACT

A chip package comprises a first chip having a first side and a second side, wherein said first chip comprises a first pad, a first trace, a second pad and a first passivation layer at said first side thereof, an opening in said first passivation layer exposing said first pad, said first trace being over said first passivation layer, said first trace connecting said first pad to said second pad; a second chip having a first side and a second side, wherein said second chip comprises a first pad at said first side thereof, wherein said second side of said second chip is joined with said second side of side first chip; a substrate joined with said first side of said first chip or with said first side of said second chip; a first wirebonding wire connecting said second pad of said first chip and said substrate; and a second wirebonding wire connecting said first pad of said second chip and said substrate.

26 Claims, 20 Drawing Sheets

U.S. PATENT DOCUMENTS

| | | | |
|---|---|---|---|
| 3,634,714 A | 1/1972 | Anderson et al. |
| 5,282,312 A | 2/1994 | DiStefano et al. |
| 5,334,874 A | 8/1994 | Metzler et al. |
| 5,365,790 A | 11/1994 | Chen et al. |
| 5,384,488 A | 1/1995 | Golshan et al. |
| 5,534,465 A | 7/1996 | Frye et al. |
| 5,696,466 A | 12/1997 | Li |
| 5,854,740 A | 12/1998 | Cha |
| 5,861,666 A | 1/1999 | Bellaar |
| 5,872,489 A | 2/1999 | Chang et al. |
| 5,929,510 A | 7/1999 | Geller et al. |
| 5,969,424 A | 10/1999 | Matsuki et al. |
| 6,066,877 A | 5/2000 | Williams et al. |
| 6,087,648 A | 7/2000 | Zhang et al. |
| 6,121,676 A | 9/2000 | Solberg |
| 6,177,731 B1 | 1/2001 | Ishida et al. |
| 6,187,680 B1 | 2/2001 | Costrini et al. |
| 6,188,028 B1 | 2/2001 | Haba et al. |
| 6,225,688 B1 | 5/2001 | Kim et al. |
| 6,229,221 B1 | 5/2001 | Kloen et al. |
| 6,229,711 B1 | 5/2001 | Yoneda |
| 6,300,234 B1 | 10/2001 | Flynn et al. |
| 6,376,904 B1 | 4/2002 | Haba et al. |
| 6,410,435 B1 | 6/2002 | Ryan |
| 6,429,112 B1 | 8/2002 | Smith et al. |
| 6,465,893 B1 | 10/2002 | Khandros et al. |
| 6,472,736 B1 * | 10/2002 | Yeh et al. ............ 257/686 |
| 6,476,506 B1 | 11/2002 | O'Connor et al. |
| 6,476,507 B1 | 11/2002 | Takehara |
| 6,496,240 B1 | 12/2002 | Zhang et al. |
| 6,548,891 B2 | 4/2003 | Mashino |
| 6,563,106 B1 | 5/2003 | Bowers et al. |
| 6,593,222 B2 | 7/2003 | Smoak |
| 6,610,934 B2 | 8/2003 | Yamaguchi et al. |
| 6,657,228 B2 | 12/2003 | Ohtani |
| 6,673,698 B1 | 1/2004 | Lin et al. |
| 6,683,380 B2 | 1/2004 | Efland et al. |
| 6,696,748 B1 * | 2/2004 | Thurgood ............ 257/668 |
| 6,699,730 B2 | 3/2004 | Kim et al. |
| 6,707,159 B1 | 3/2004 | Kumamoto et al. |
| 6,756,664 B2 | 6/2004 | Yang |
| 6,762,122 B2 | 7/2004 | Mis et al. |
| 6,791,178 B2 | 9/2004 | Yamaguchi et al. |
| 6,798,050 B1 | 9/2004 | Homma et al. |
| 6,800,555 B2 | 10/2004 | Test et al. |
| 6,844,631 B2 | 1/2005 | Yong et al. |
| 6,885,106 B1 | 4/2005 | Damberg et al. |
| 6,897,565 B2 | 5/2005 | Pflughaupt et al. |
| 6,913,949 B2 | 7/2005 | Pflughaupt et al. |
| 6,933,601 B2 | 8/2005 | Satoh et al. |
| 6,940,158 B2 | 9/2005 | Haba et al. |
| 6,952,047 B2 | 10/2005 | Li |
| 6,965,158 B2 | 11/2005 | Smith et al. |
| 6,973,709 B2 | 12/2005 | Huang |
| 6,977,440 B2 | 12/2005 | Pflughaupt et al. |
| 6,979,647 B2 | 12/2005 | Bojkov et al. |
| 6,989,600 B2 | 1/2006 | Kubo et al. |
| 7,045,899 B2 | 5/2006 | Yamane et al. |
| 7,060,607 B2 | 6/2006 | Efland |
| 7,061,121 B2 | 6/2006 | Haba |
| 7,067,926 B2 | 6/2006 | Yamazaki et al. |
| 7,071,547 B2 | 7/2006 | Kang et al. |
| 7,115,488 B2 | 10/2006 | Isobe et al. |
| 7,149,095 B2 | 12/2006 | Warner et al. |
| 7,183,643 B2 | 2/2007 | Gibson et al. |
| 7,220,667 B2 | 5/2007 | Yamagata |
| 7,229,850 B2 | 6/2007 | Li |
| 7,294,905 B2 | 11/2007 | Ogino et al. |
| 7,335,995 B2 | 2/2008 | Pflughaupt et al. |
| 7,342,258 B2 | 3/2008 | Yamazaki et al. |
| 7,397,117 B2 | 7/2008 | Lin et al. |
| 7,417,865 B2 | 8/2008 | Kim |
| 7,470,865 B2 | 12/2008 | Fushie et al. |
| 7,508,059 B2 | 3/2009 | Lin et al. |
| 7,545,044 B2 | 6/2009 | Shibayama et al. |
| 7,589,409 B2 | 9/2009 | Gibson et al. |
| 7,629,686 B2 * | 12/2009 | Kinsman ............ 257/737 |
| 7,653,371 B2 | 1/2010 | Floyd |
| 7,657,242 B2 | 2/2010 | Floyd |
| 7,678,695 B2 | 3/2010 | Taniguchi et al. |
| 7,786,002 B2 | 8/2010 | Leib et al. |
| 7,787,130 B2 | 8/2010 | Webster |
| 7,830,588 B2 | 11/2010 | Miles |
| 7,839,356 B2 | 11/2010 | Hagood et al. |
| 7,848,004 B2 | 12/2010 | Miles |
| 7,863,524 B2 | 1/2011 | Shioga et al. |
| 7,881,686 B2 | 2/2011 | Floyd |
| 7,973,401 B2 | 7/2011 | Lin et al. |
| 7,977,763 B2 | 7/2011 | Lin et al. |
| 2001/0035452 A1 | 11/2001 | Test et al. |
| 2001/0040290 A1 | 11/2001 | Sakurai et al. |
| 2001/0051426 A1 | 12/2001 | Pozder et al. |
| 2002/0000671 A1 | 1/2002 | Zuniga et al. |
| 2002/0005577 A1 | 1/2002 | Shimoda |
| 2002/0043723 A1 | 4/2002 | Shimizu et al. |
| 2002/0089050 A1 | 7/2002 | Michii et al. |
| 2003/0057539 A1 | 3/2003 | Koopmans |
| 2003/0107118 A1 | 6/2003 | Pflughaupt et al. |
| 2003/0203537 A1 | 10/2003 | Koopmans |
| 2004/0031972 A1 | 2/2004 | Pflughaupt et al. |
| 2004/0070083 A1 | 4/2004 | Su |
| 2004/0203190 A1 | 10/2004 | Pflughaupt et al. |
| 2004/0217485 A1 | 11/2004 | Chung |
| 2005/0098869 A1 | 5/2005 | Shiozawa |
| 2005/0173796 A1 | 8/2005 | Pflughaupt et al. |
| 2005/0194672 A1 | 9/2005 | Gibson et al. |
| 2006/0033216 A1 | 2/2006 | Pflughaupt et al. |
| 2006/0202317 A1 | 9/2006 | Barakat et al. |
| 2007/0290316 A1 | 12/2007 | Gibson et al. |
| 2008/0284037 A1 | 11/2008 | Andry et al. |

FOREIGN PATENT DOCUMENTS

| | | |
|---|---|---|
| TW | 577153 B | 2/2004 |
| TW | 588446 B | 5/2004 |
| TW | I225299 B | 12/2004 |
| TW | I227553 B | 2/2005 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology ™—MEGIC ® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

340

340

340

STACKED CHIP PACKAGE WITH REDISTRIBUTION LINES

This application is a continuation of application Ser. No. 12/269,045, filed on Nov. 12, 2008, now U.S. Pat. No. 7,973,401, which is a continuation of application Ser. No. 11/416,134, filed on May 3, 2006, now U.S. Pat. No. 7,508,059, which claims the priority benefit of Taiwan application Ser. No. 094114203, filed on May 3, 2005, all of which are incorporated herein by reference.

FIELD OF THE INVENTION

The invention relates in general to a stacked chip package and a process for forming the same. More particularly, the invention relates to a stacked chip package, wherein the pad position of the chip for wires through wire bonding can be changed through redistribution lines and a process for forming the same.

DESCRIPTION OF THE RELATED ART

Nowadays, advanced data processing and communication play an important role in the modern society. In order to fulfill the requirements of electronic devices, such as high speed processing, multifunction tasks, integration, small size and light weight . . . etc, the package technology of the integrated circuit is developed towards micro-size and high density. For example, Chip Scale Package (CSP), Flip Chip Package and Multi-Chip Module (MCM) Package have emerged.

In Multi-Chip Module package, multiple chips with different or same function are packaged on a carrier, such as a substrate or a lead frame, which is connected electrically to external circuit. For instance, the stacked chip package is one of common Multi-Chip Module. In the stacked chip package, multiple same chips are stacked and then encapsulated in a package to enhance the efficiency of performance by means of the integration of the same chips. The stacked chip package not only can offer the higher transmission speed, that is, the shorter transmission path, the better electronic performance, but can also reduce the size of chip package and its area. Therefore, the stacked chip package has been generally applied in many various electronic products and will become the main stream of chip package in the future.

For example in Dynamic Random Access Memory, DRAM, multiple chips, which have the same size of the memory storage, can be integrated in one package on base of the stacked chip package to improve the processing speed. In addition, the stacked chip package will not cause a really dramatic change of package appearance, so that the package density can be increased and the occupied space can be reduced. Moreover, in the stacked chip package, it is not necessary to renew the design of the circuit layout. It can also provide a better efficiency of processing. As a result, it can decrease the cost of the research dramatically and enhance competitiveness of a product in the market.

Referring to FIG. 1 and FIG. 2, showing cross-sectional views of two traditional stacked chip packages with a window ball grid array (BGA) type, in the stacked chip package 100, two semiconductor chips with a same type, first semiconductor chip 110 and second semiconductor chip 120, are stacked back to back and then are electrically connected to a substrate 130 using a wire bonding process and connected outwardly through a solder ball 190 on the substrate 130. As shown in FIG. 1 and FIG. 2, the first chip 110 is provided with a first active surface 110a and a corresponding first back surface 110b. The second chip 120 is provided with a second active surface 120a and a corresponding second back surface 120b. The first chip 110 and the second chip 120 are stacked with the first back surface 110b being in contact with the second back surface 120b. The substrate 130 is provided with a top surface 130a and a corresponding bottom surface 130b. There are multiple first pads 132 on the top surface 130a and multiple second pads 134 on the bottom surface 130b. There is an opening in the center of the substrate 130. The first chip 110 is located on the substrate 130 with the first active surface 110a of the first chip 110 facing the top surface 130a of the substrate 130.

As above mentioned, because the positions of pads on a semiconductor chip are different, the wires through wire bonding between the semiconductor chip and a substrate are arranged differently. As shown in FIG. 1, the chip pads 122 of the second chip 120 are located in the central region thereof and connected to the first pads 132 of the substrate 130 through multiple second wires 160 formed by a wire bonding process. The first chip pads 112 of the first chip 110 are located in the central region of the first active surface 110a thereof. The first wires 150 formed by a wire bonding process go through the opening 136 and connect the first chip pads 112 and the second pads 134 of the substrate 130. In order to connect the second chip 120 and the substrate 130, the second wires 160 formed by a wire bonding process has to go from the central region of the second active surface 120a to the top surface 130a of the substrate 130. The second wires 160 are so long that the electrical performance of signal transmitted between the second chip 120 and the substrate 130 is negatively affected.

As shown in FIG. 2, the first chip pads 112 of the first semiconductor chip 110 are located in the peripheral region of the first active surface 110a. Similarly, the second chip pads 122 of the second chip 120 are located in the peripheral region of the second active surface 120a. Thereby, the second wires 160 formed by a wirebonding process may have a reduced distance between the chip pads 122 of the second chip 120 and the first pads 132 of the substrate 130. However, the first chip pads 112 of the first chip 110 are blocked by the substrate 130, so that it cannot be connected to the second pads 134 of the substrate 130 by using a wirebonding process.

To solve the problems mentioned above, it is known that the first chip and the second chip ought to be provided with different pad layout exposed by openings in a passivation layer comprising nitride. For example, the chip pads of the first chip exposed by openings in a passivation layer comprising nitride can be located in the central region of the active surface and the chip pads of the second chip exposed by openings in a passivation layer comprising nitride can be located in the peripheral region of the active surface. However, if they are changed in this way, the electric devices or circuits formed inside the semiconductor chip has to be rerouted. This change of rerouting the electric devices and circuits takes a lot of effort, but just develops a semiconductor chip with same functions. It cannot meet the requirement for lowering production costs.

SUMMARY OF THE INVENTION

Therefore, one objective of the present invention is to provide a chip package with shorter wirebonding wires. A better electric performance of transmitting signals through the wirebonding wires can be achieved.

Furthermore, multiple pads of a semiconductor chip blocked by a substrate can be avoided and it is not needed to redesign the circuit layout under a passivation layer of the semiconductor chip.

In order to reach the above objectives, the present invention provides a chip package comprising a first semiconductor chip having a first side and a second side, wherein said first semiconductor chip comprises a first pad, a first trace, a second pad and a first passivation layer at said first side thereof, an opening in said first passivation layer exposing said first pad, said first trace connecting said first pad to said second pad, the position of said second pad from a top view being different that of said first pad; a second semiconductor chip having a first side and a second side, wherein said second semiconductor chip comprises a first pad at said first side thereof, wherein said second side of said second semiconductor chip is joined with said second side of side first semiconductor chip; a substrate joined with said first side of said first semiconductor chip or with said first side of said second semiconductor chip; a first wirebonding wire connecting said second pad of said first semiconductor chip and said substrate; and a second wirebonding wire connecting said first pad of said second semiconductor chip and said substrate.

Both the foregoing general description and the following detailed description are exemplary and explanatory only and are not restrictive to the invention, as claimed. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated as a part of this specification. The drawings illustrate embodiments of the invention and, together with the description, serve to explain the principles of the invention.

DESCRIPTION OF THE PREFERRED EMBODIMENTS

First Embodiment

Figure 1:
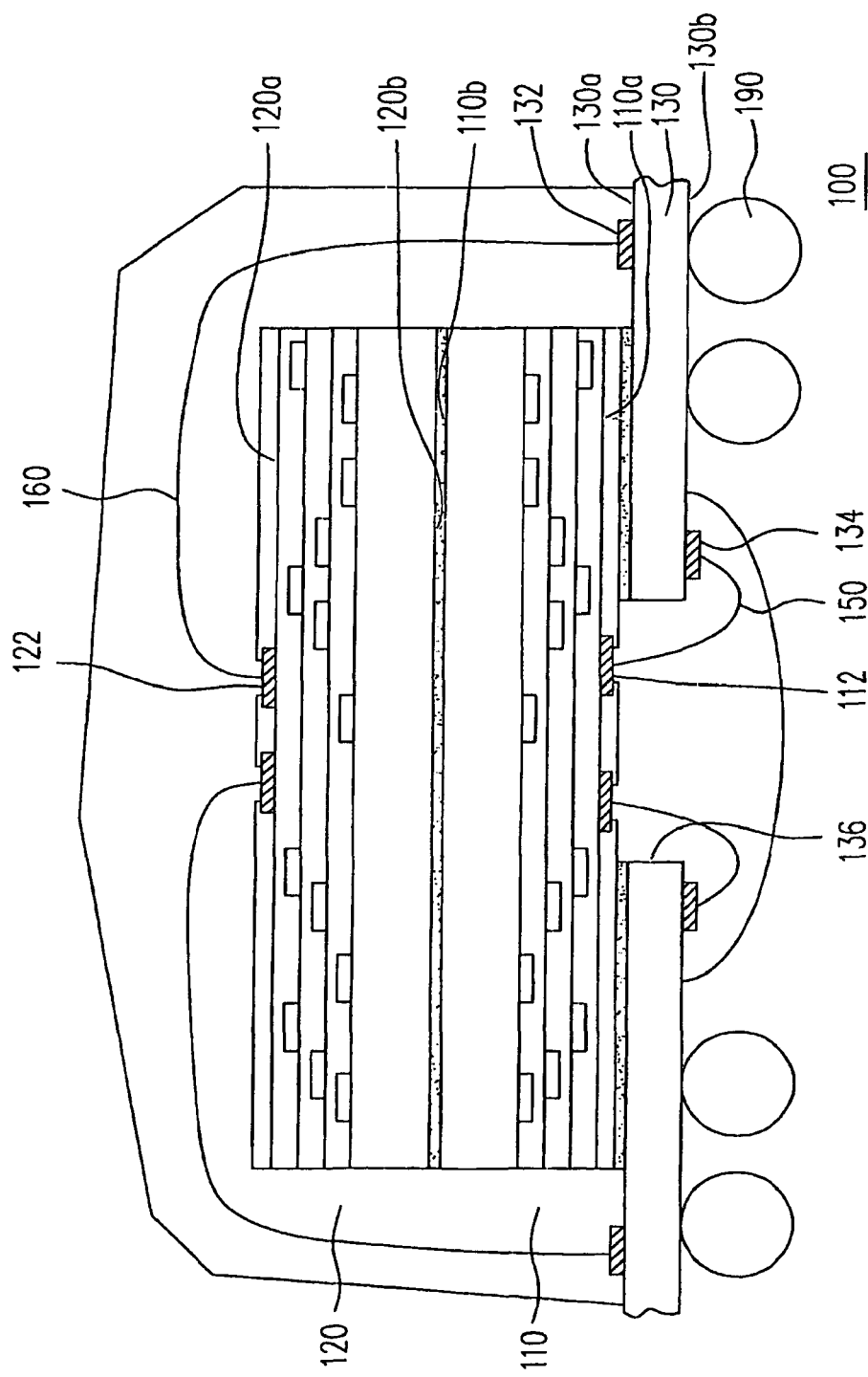
FIG. 1 and FIG. 2 show cross-sectional views of two traditional stacked chip packages with a window ball grid array (BGA) type.
Figure 2:
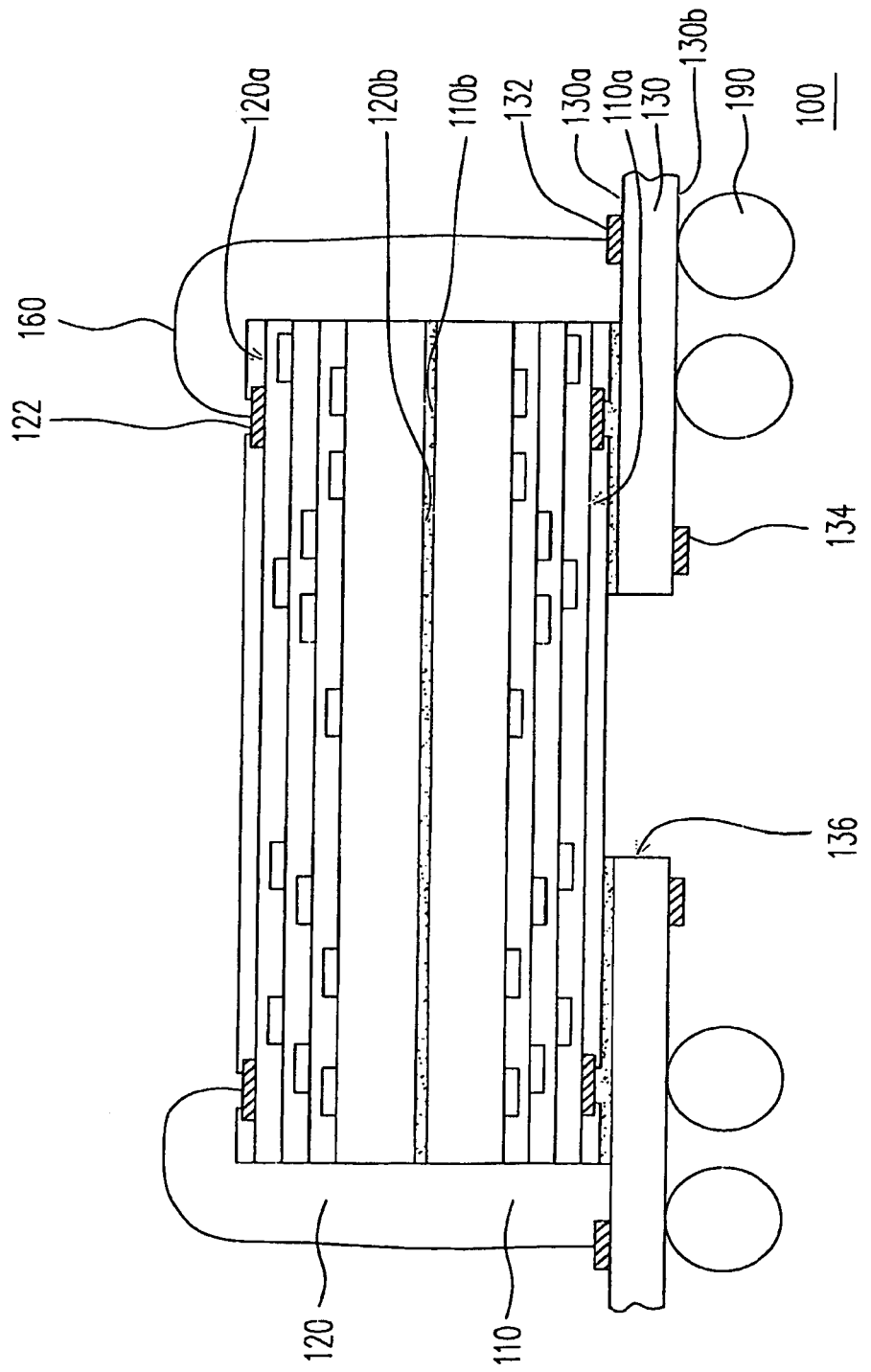

FIG. 3 through FIG. 6 schematically show a process for fabricating a stacked chip package in a first embodiment of the present invention. Referring to FIG. 3 through FIG. 6, a first semiconductor chip 310 and second semiconductor chip 320 are provided with a same circuit layout under first and second passivation layers 314 and 324 thereof. The first semiconductor chip 310 is provided with multiple first chip pads 312 located on a first active surface 310a of the first chip 310. The first chip pads 312 are located in the peripheral region of the first active surface 310a. The first passivation layer 314 has multiple openings 314a for exposing the first chip pads 312. The second semiconductor chip 320 is provided with multiple second chip pads 322 located on a second active surface 320a of the second chip 320. The second chip pads 322 are located in the peripheral region of the second active surface 320a. The second passivation layer 324 has multiple openings 324a for exposing the second chip pads 322.

In a case, each of the first and second passivation layers 314 and 324 can be formed by first depositing a silicon-oxide layer with a thickness of between 0.2 and 0.7 microns using a PECVD process, then depositing a silicon-nitride layer with a thickness of between 0.2 and 0.7 microns on the silicon-oxide layer using a PECVD process.

In another case, each of the first and second passivation layers 314 and 324 can be formed by first depositing a silicon-oxide layer with a thickness of between 0.2 and 0.7 microns using a PECVD process, then depositing a silicon-oxynitride layer with a thickness of between 0.05 and 0.15 microns on the silicon-oxide layer using a PECVD process, and then depositing a silicon-nitride layer with a thickness of between 0.2 and 0.7 microns on the silicon-oxynitride layer using a PECVD process.

In another case, each of the first and second passivation layers 314 and 324 can be formed by first depositing a silicon-oxynitride layer with a thickness of between 0.05 and 0.15 microns using a PECVD process, then depositing a silicon-oxide layer with a thickness of between 0.2 and 0.7 microns on the silicon-oxynitride layer using a PECVD process, and then depositing a silicon-nitride layer with a thickness of between 0.2 and 0.7 microns on the silicon-oxide layer using a PECVD process.

In another case, each of the first and second passivation layers 314 and 324 can be formed by first depositing a silicon-oxide layer with a thickness of between 0.2 and 0.5 microns using a PECVD process, then depositing a silicon-oxide layer with a thickness of between 0.5 and 1 microns on the PECVD silicon-oxide layer using a spin-coating process, then depositing a silicon-oxide layer with a thickness of between 0.2 and 0.5 microns on the spin-coated silicon-oxide layer using a PECVD process, and then depositing a silicon-nitride layer with a thickness of between 0.2 and 0.7 microns on the PECVD silicon-oxide layer using a PECVD process.

In another case, each of the first and second passivation layers 314 and 324 can be formed by first depositing a silicon-oxide layer with a thickness of between 0.5 and 2 microns using a HDP-CVD process, and then depositing a silicon-nitride layer with a thickness of between 0.2 and 0.7 microns on the silicon-oxide layer using a PECVD process.

In another case, each of the first and second passivation layers 314 and 324 can be formed by first depositing a USG layer with a thickness of between 0.2 and 3 microns, then depositing a layer of TEOS, BPSG or PSG with a thickness of between 0.5 and 3 microns on the USG layer, and then depositing a silicon-nitride layer with a thickness of between 0.2 and 0.7 microns on the layer of TEOS, BPSG or PSG using a PECVD process.

In another case, each of the first and second passivation layers 314 and 324 can be formed by optionally first depositing a first silicon-oxynitride layer with a thickness of between 0.05 and 0.15 microns using a PECVD process, then depositing a silicon-oxide layer with a thickness of between 0.2 and 0.7 microns optionally on the first silicon-oxynitride layer using a PECVD process, then optionally depositing a second silicon-oxynitride layer with a thickness of between 0.05 and 0.15 microns on the silicon-oxide layer using a PECVD process, then depositing a silicon-nitride layer with a thickness of between 0.2 and 0.7 microns on the second silicon-oxynitride layer or on the silicon-oxide layer using a PECVD process, then optionally depositing a third silicon-oxynitride layer with a thickness of between 0.05 and 0.15 microns on the silicon-nitride layer using a PECVD process, and then depositing a silicon-oxide layer with a thickness of between 0.2 and 0.7 microns on the third silicon-oxynitride layer or on the silicon-nitride layer using a PECVD process.

In another case, each of the first and second passivation layers 314 and 324 can be formed by first depositing a first silicon-oxide layer with a thickness of between 0.2 and 0.7 microns using a PECVD process, then depositing a second silicon-oxide layer with a thickness of between 0.5 and 1 microns on the first silicon-oxide layer using a spin-coating process, then depositing a third silicon-oxide layer with a thickness of between 0.2 and 0.7 microns on the second silicon-oxide layer using a PECVD process, then depositing a silicon-nitride layer with a thickness of between 0.2 and 0.7 microns on the third silicon-oxide layer using a PECVD process, and then depositing a fourth silicon-oxide layer with a thickness of between 0.2 and 0.7 microns on the silicon-nitride layer using a PECVD process.

In another case, each of the first and second passivation layers 314 and 324 can be formed by first depositing a silicon-oxide layer with a thickness of between 0.5 and 2 microns using a HDP-CVD process, then depositing a silicon-nitride layer with a thickness of between 0.2 and 0.7 microns on the silicon-oxide layer using a PECVD process, and then depositing another silicon-oxide layer with a thickness of between 0.5 and 2 microns on the silicon-nitride layer using a HDP-CVD process.

Figure 3:
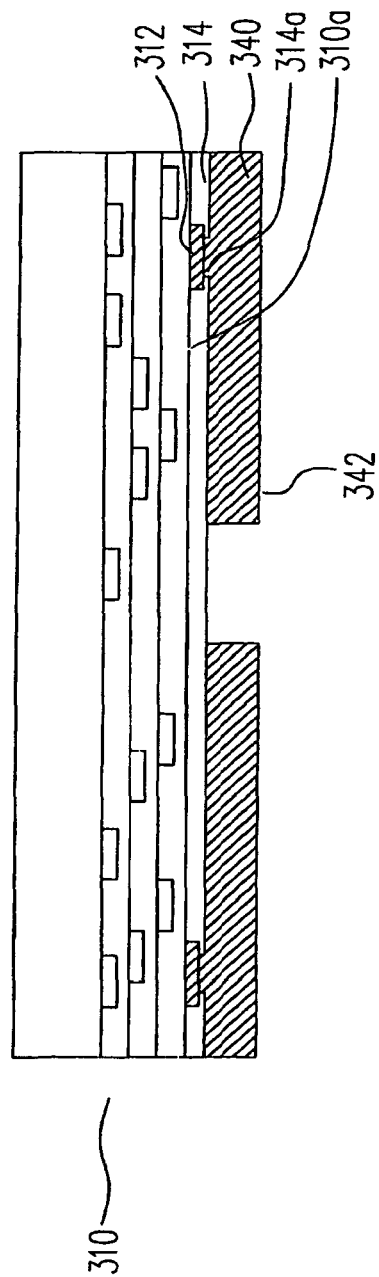
FIG. 3 through FIG. 6 schematically show a process for fabricating a stacked chip package in a first embodiment of the present invention.

A description of the stacked chip package structure of the present invention is as follows:

First, as shown in FIG. 3, multiple first redistribution lines 340 are formed on the first passivation layer 314 of a first semiconductor wafer. After cutting the first semiconductor wafer, multiple individual first semiconductor chips 310 with the first redistribution lines 340 on the first passivation layer 314 are formed. The first redistribution lines 340 have multiple pads 342 electrically connected to the first chip pads 312. These pads 342 of the first redistribution lines are located in the central region of the first semiconductor chip 310.

Figure 4:
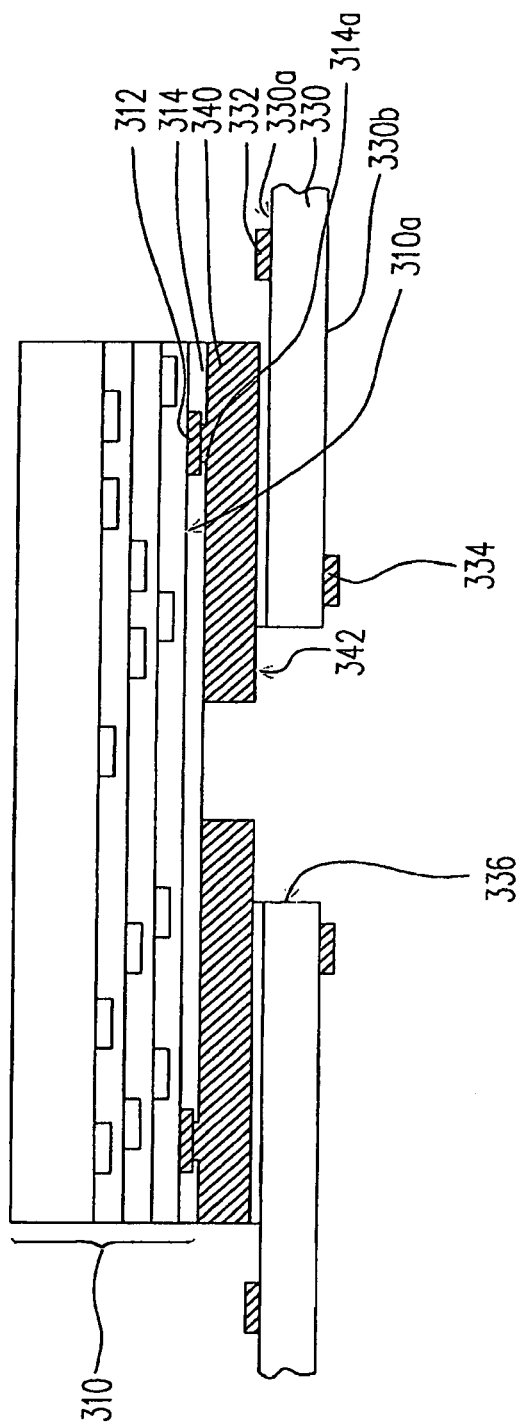

Next, as shown in FIG. 4, the first semiconductor chip 310 is being mounted on a substrate 330, such as printed circuit board, flexible substrate with only one circuit layer and only one polymer layer formed on the circuit layer, ceramic substrate, or glass substrate. The substrate 330 has multiple first substrate pads 332 and multiple second substrate pads 334 located on a top surface 330a and a bottom surface 330b of the substrate 330, respectively. An opening 336 in the substrate 330 passes through the substrate 330. The first active surface 310a of the first chip 310 is adhered to the top surface 330a of the substrate 330. The first redistribution pads 342 are exposed by the opening 336 in the substrate 330.

Figure 5:
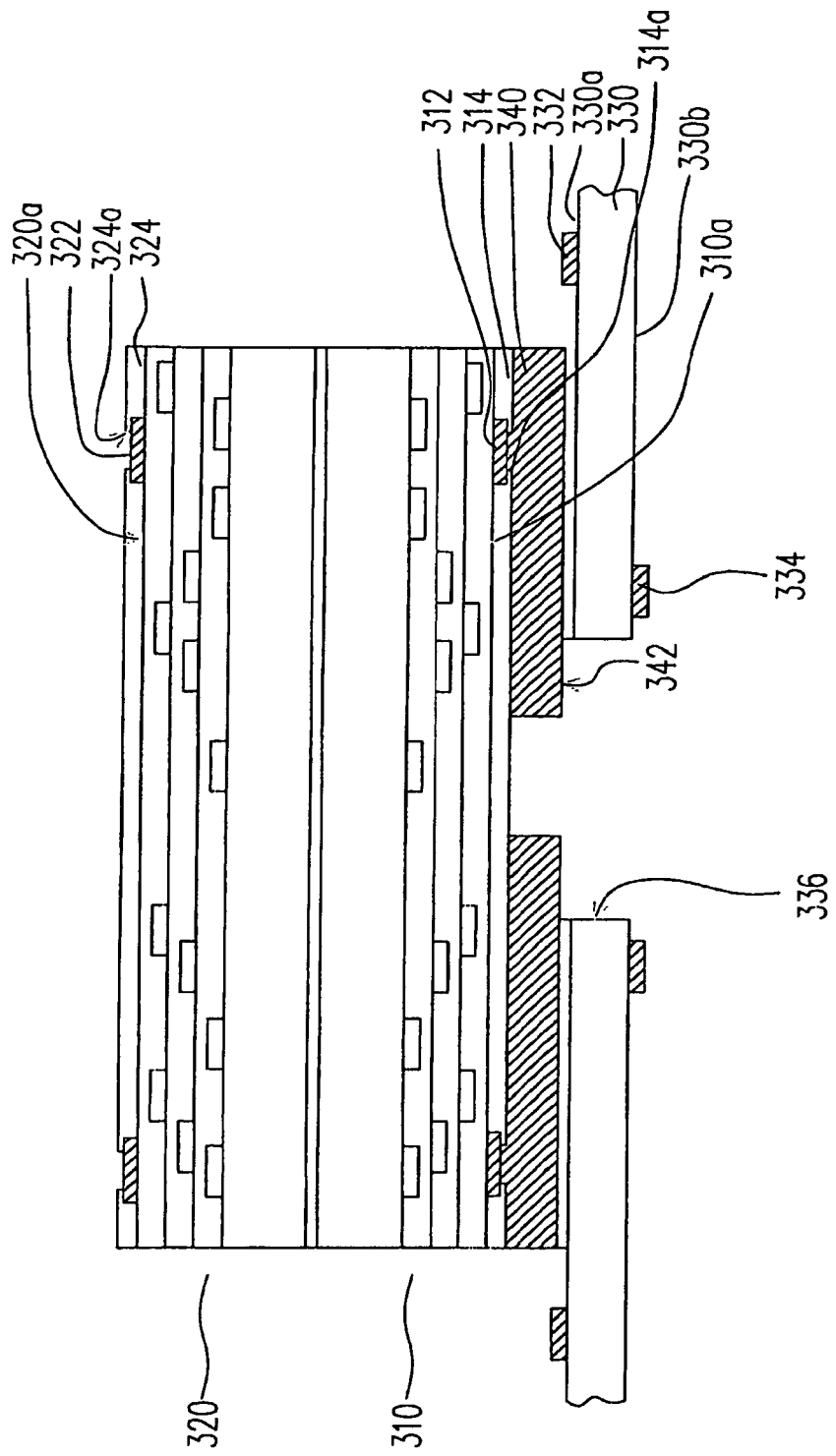

Subsequently, as shown in FIG. 5, the back surface 320b of the second chip 320 is back to back joined to the back surface 310b of the first chip 310.

Figure 6:
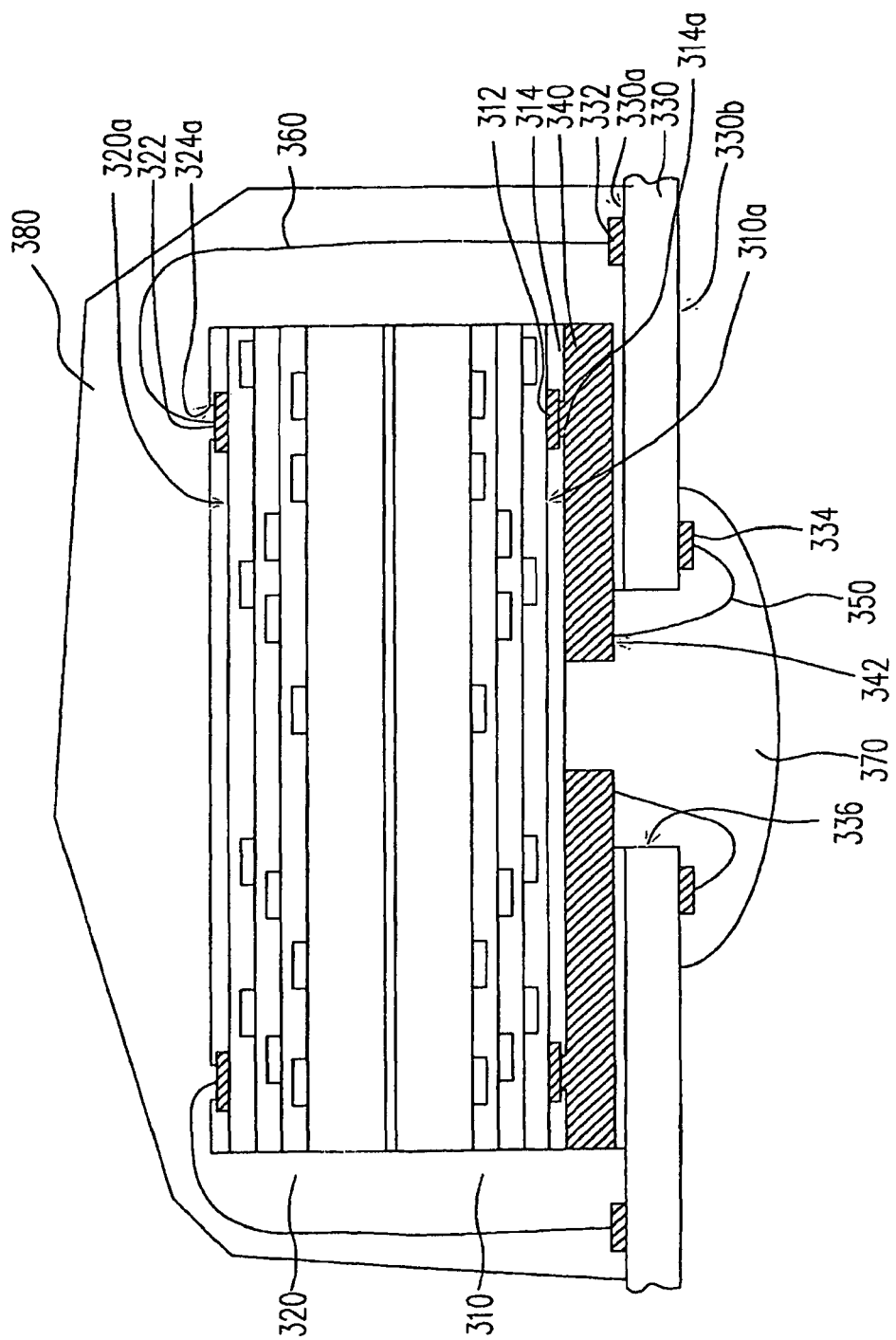

Next, as shown in FIG. 6, a wire bonding process is performed to form multiple first wires 350 connecting the first redistribution pads 342 and the second substrate pads 334 through the opening 336 in the substrate 330 and to form multiple second wires 360 connecting the second chip pads 322 and the first substrate pads 332. Afterwards, an encapsulation process is performed to form a first molding compound 370 in the opening 136 in the substrate 330 and on the bottom surface 330b of the substrate 330 and to form a second molding compound 380 on the second semiconductor chip 320 and on the top surface 330a of the substrate 330. The first molding compound 370 and the second molding compound 380 enclose the first wires 350 and the second wires 360, respectively. The first molding compound 370 and the second molding compound 380 maybe a thermosetting polymer or a thermoplastic polymer.

Two points are especially worthy of notice.

First, the order of two steps described in FIG. 4 and FIG. 5 can be interchangeable. Specifically, the first chip 310 and the second chip 320 can be first joined to each other, and then the unity of the first chip 310 and the second chip 320 can be disposed onto the substrate 330.

Second, as shown in FIG. 6, the wire bonding process and the encapsulating process can be performed in other sequences. For example, the process for fabricating the chip package can be performed by first wirebonding the first wires 350, next forming the first molding compound 370, next wirebonding the second wires 360, and then forming the second molding compound 380. Alternatively, the process for fabricating the chip package can be performed by first wirebonding the second wires 360, next forming the second molding compound 380, next wirebonding the first wires 350, and then forming the first molding compound 370. The first wires 350 and the second wires 360 may comprise gold. Alternatively, the process for fabricating the chip package can be performed by first wirebonding the first wires 350 and the second wires 360, and then forming the first molding compound 370 and the second molding compound 380.

In the embodiment above mentioned, the main components of the stacked chip package structure of the present invention have been illustrated. However, in the practical situation, the process for fabricating a stacked chip package may include other steps. For example, multiple sold balls may be formed on the bottom surface of the substrate; a polymer layer may be formed on the passivation layer; a polymer layer may be formed on the redistribution lines. The redistribution structure may be composed of not only a single patterned circuit layer, as shown in FIG. 6 but multiple patterned circuit layers.

Figure 7:
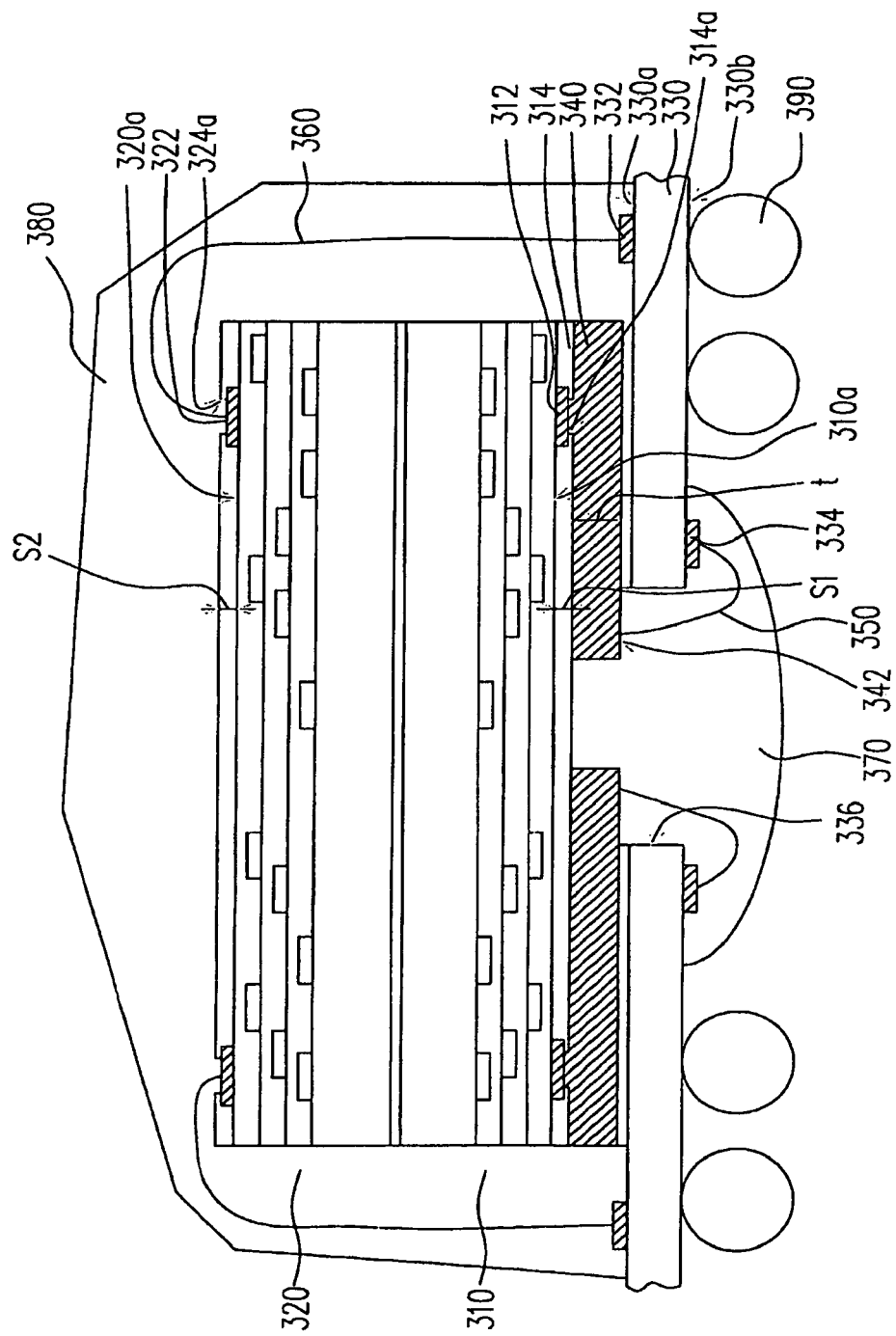
FIG. 7 shows a schematic view of a stacked chip package structure according to a first embodiment.

FIG. 7 shows a schematic view of a stacked chip package structure according to a first embodiment. The reference number in FIG. 7 indicates the same part or the like as those indicated by the same reference number in FIGS. 3-6. The description of the arrangement of the substrate 330, the first and second semiconductor chips 310 and 320, the first and second wires 350 and 360 formed by a wire bonding process, and the first and second molding compound 370 and 380 can be referred to the above illustration.

As shown in FIG. 7, the stacked chip package 300 may include the first semiconductor chip 310, the second semiconductor chip 320, the substrate 330, the first redistribution lines 340, the first and second wires 350 and 360 formed by a wire bonding process, the first and second molding compound 370 and 380, and multiple solder balls 390. The first semiconductor chip 310 and the second semiconductor chip 320 stacked back to back are disposed on the substrate 330. The first redistribution lines 340 are disposed on the first passivation layer 314 of the first chip 310 and provide multiple first redistribution pads 342 that are located in the central region of the first semiconductor chip 310 and electrically connected to the substrate pads 334 through the first wires 350 formed by a wire bonding process. Multiple solder balls 390 are disposed on the bottom surface 330b of the substrate 330 and serves as the means for the electrical connection of the first chip 310 and the second chip 320 to an external circuit. The material of the solder ball can include an alloy of tin and lead or an alloy of tin, silver and cooper.

Referring to FIG. 7, the thicknesses s1 and s2 of the first passivation layer 314 and the second passivation layer 324 are more than 0.35 micrometer. The passivation layer may be constructed of a silicon nitride compound, a silicon oxide compound, a phosphosilicate glass (PSG), or a composite including at lease one of the above materials.

Figure 8A:
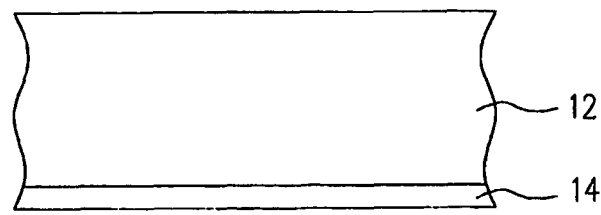
FIG. 8A through FIG. 8C are schematic cross-sectional views showing various metallization structure of the first redistribution lines 340.
Figure 8B:
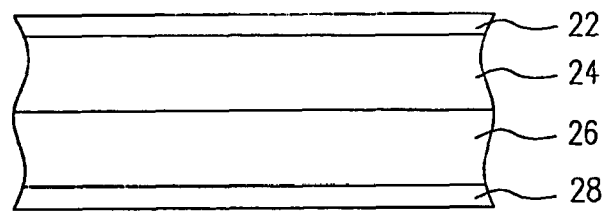
Figure 8C:

It is remarkable that the first redistribution lines 340 of the present invention can be constructed of one or multiple patterned circuit layers. Various structures and materials can be applied to the patterned circuit layers. For example, the first redistribution lines 340 formed from a single patterned circuit layer is shown in FIG. 7. The thickness t of the redistribution lines 340 is larger than 1 micrometer. FIG. 8A through FIG. 8C are schematic cross-sectional views showing various metallization structure of the first redistribution lines 340.

As above mentioned and as shown in FIG. 8A, the first redistribution lines 340 are constructed of one layer or multiple layers of well-conductive metal and an adhesion/barrier layer. The adhesion/barrier layer is made of a titanium layer, an alloy layer of titanium and tungsten or a composite of a chromium layer and an alloy layer of chromium and copper. According to an embodiment in FIG. 8A, the adhesion/barrier layer 14 is an alloy layer of titanium and tungsten and the metal layer 12 is a gold layer with a thickness of between 1 and 15 microns. In addition, as shown in FIG. 8B, the first redistribution lines 340 can be constructed of a titanium layer 28, a copper layer 26 with a thickness of between 1 and 30 microns, a nickel layer 24 with a thickness of between 1 and 10 microns, and a gold layer 22. The titanium or chromium layer 28 is used for the adhesion/barrier layer. The gold layer 22 and the nickel layer 24 can be optionally formed onto the copper layer 26. Moreover, as shown in FIG. 8C, the first redistribution lines can be a single layer of aluminum 32.

Second Embodiment

According to the above mentioned first embodiment, the redistribution lines are disposed on the first semiconductor chip in order to avoid the chip pads in the peripheral region of the first semiconductor chip being blocked by the substrate and to solve the incapability of being wirebonded to the first chip.

Similarly, the present invention can solve the problem of the wires formed by a wire bonding process being too long in case that the chip pads of the first and second semiconductor chips are located in the central region thereof.

FIG. 9 to FIG. 12 are schematically cross-sectional views showing a process for fabricating a stacked chip package structure according to a second embodiment of the present invention. As shown from FIG. 9 to FIG. 12, first and second semiconductor chips 410 and 420 are provided with a same circuit layout under first and second passivation layers 414 and 424 thereof. The first chip 410 has multiple first chip pads 412 in a central region of thereof. The first passivation layer 414 on the first active surface 410a has multiple openings 414a for exposing the first pads 412. The second chip 420 is provided with multiple second chip pads 422 and the second passivation layer 424 on the second active surface 420a of the second chip 420. The second chip pads 422 are located in the central region of the second chip 420. The second passivation layer 424 has multiple openings 424a to expose the second chip pads 422.

Figure 9:
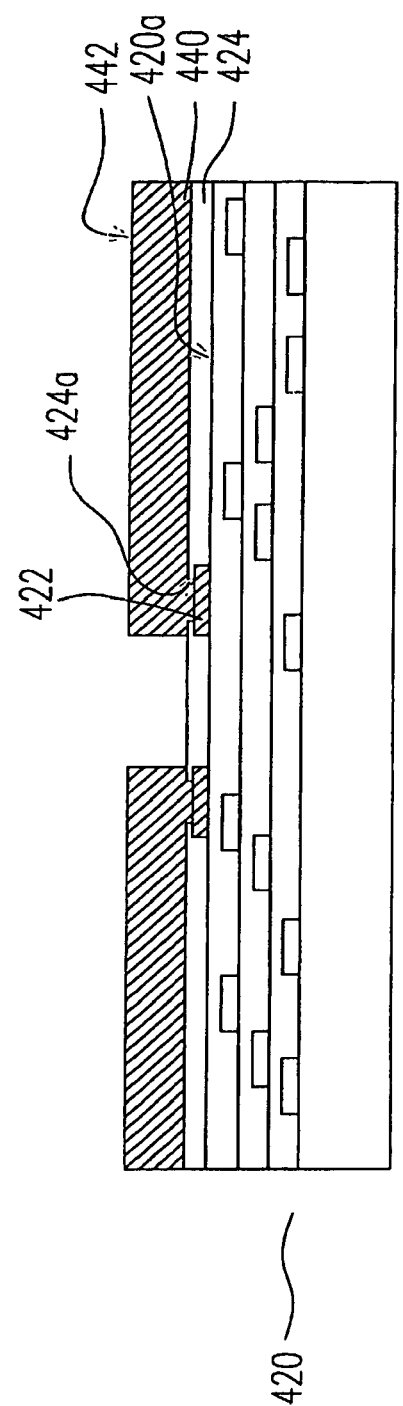
FIG. 9 to FIG. 12 are schematically cross-sectional views showing a process for fabricating a stacked chip package structure according to a second embodiment of the present invention.

A description for a stacked chip package structure of the present invention is as follows:

First, as shown in FIG. 9, multiple second redistribution lines 440 are fowled on the second passivation layer 424 of a second semiconductor wafer. After cutting the second semiconductor wafer, multiple individual second semiconductor chips 420 with the second redistribution lines 440 on the second passivation layer 424 are formed. The second redistribution lines 440 have multiple pads 442 electrically connected to the second chip pads 422. The pads 442 of the second redistribution lines 440 are located in the peripheral region of the second semiconductor chip 420.

Figure 10:
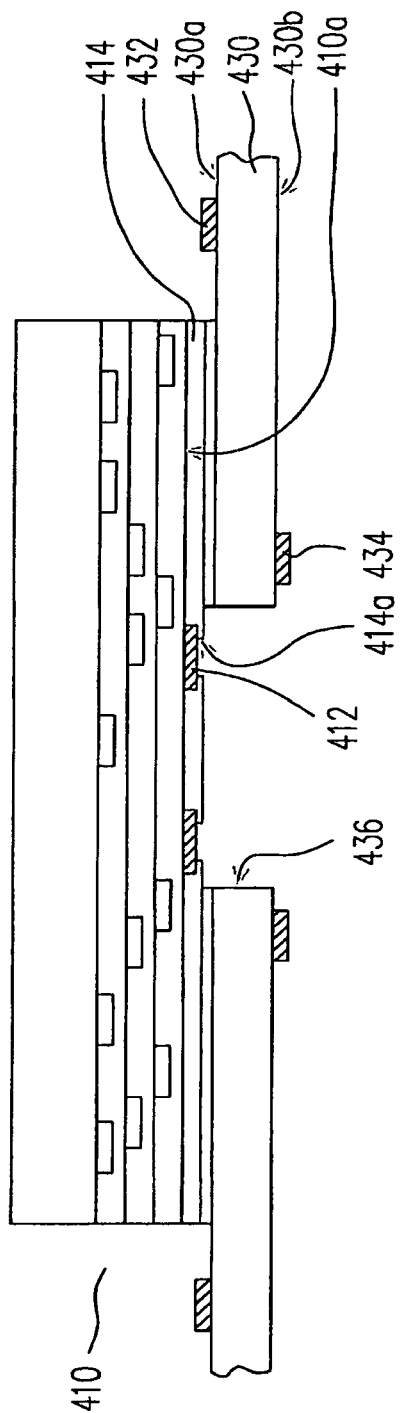

Next, as shown in FIG. 10, the first semiconductor chip 410 is being mounted on a substrate 430, such as printed circuit board, flexible substrate with only one circuit layer and only one polymer layer formed on the circuit layer, ceramic substrate, or glass substrate. The substrate 430 has multiple first substrate pads 432 and multiple second substrate pads 434 located on a top surface 430a and a bottom surface 430b of the substrate 430, respectively. An opening 436 in the substrate 430 passes through the substrate 430. The first active surface 410a of the first chip 410 is adhered to the top surface 430a of the substrate 430. The first chip pads 412 are exposed by the opening 436 in the substrate 430.

Figure 11:
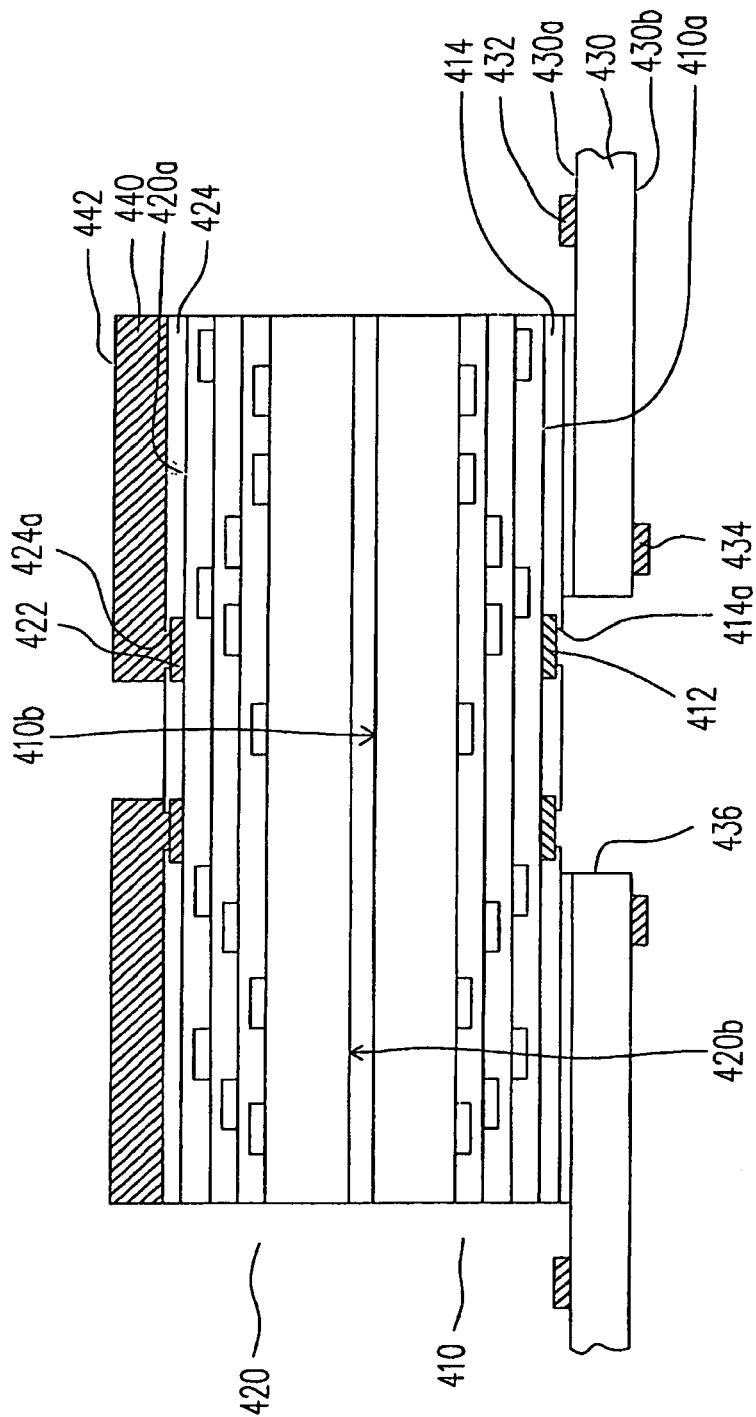

Next, as shown in FIG. 11, the back surface 420b of the second chip 420 is back to back joined to the back surface 410b of the first chip 410.

Figure 12:
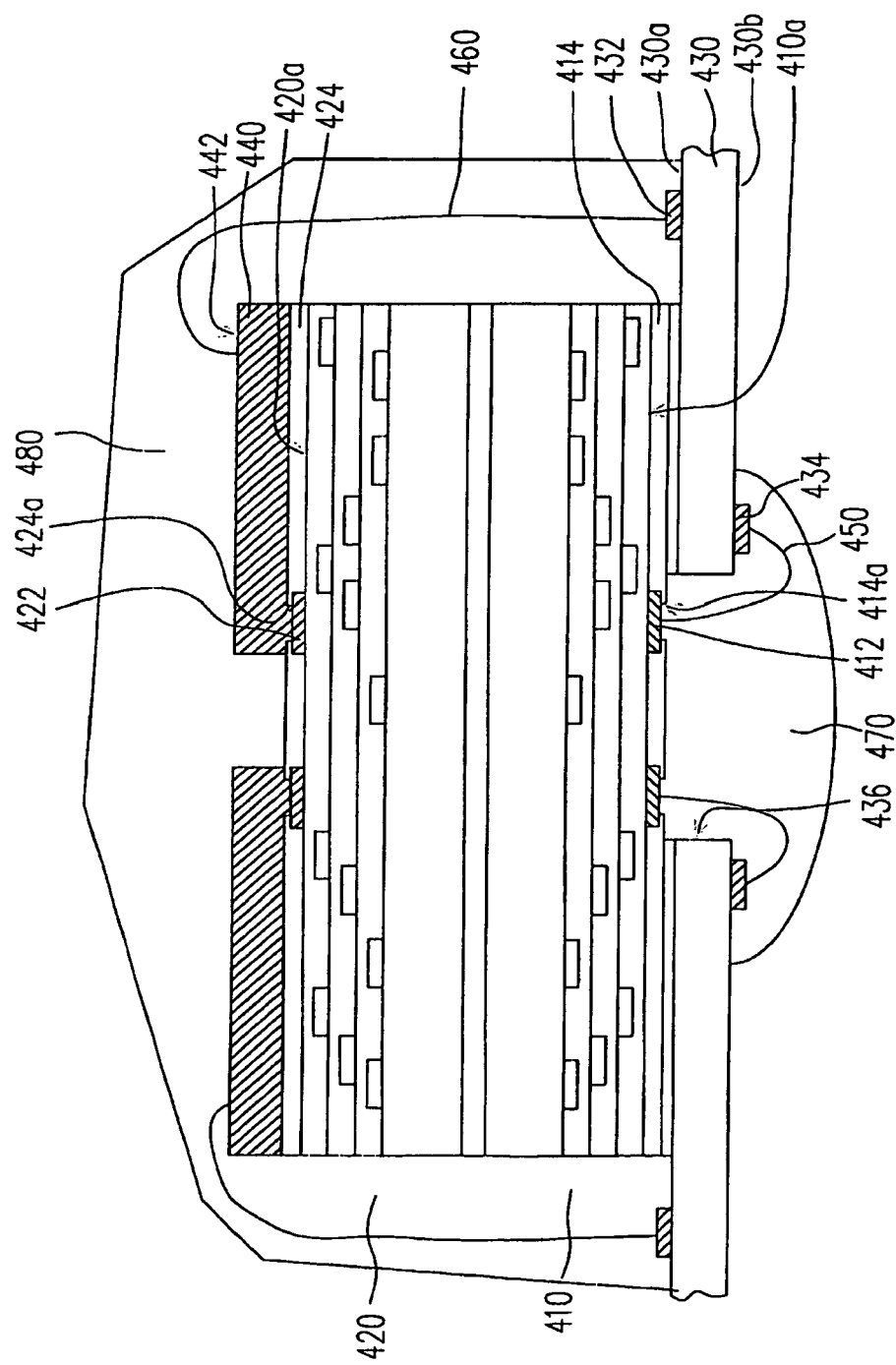

Subsequently, as shown in FIG. 12, a wire bonding process is performed to form multiple first wires 450 connecting the first chip pads 412 and the second substrate pads 434 through the opening 436 in the substrate 430 and to form multiple second wires 460 connecting the second redistribution pads 442 and the first substrate pads 432. Afterwards, an encapsulation process is performed to form a first molding compound 470 in the opening 436 in the substrate 430 and on the bottom surface 430b of the substrate 430 and to form a second molding compound 480 on the second semiconductor chip 420 and on the top surface 430a of the substrate 430. The first molding compound 470 and the second molding compound 480 enclose the first wires 450 and the second wires 460, respectively. The first molding compound 470 and the second molding compound 480 maybe a thermosetting polymer or a thermoplastic polymer.

As mentioned in the first embodiment of the present invention, the order of two steps described in FIG. 10 and FIG. 11 can be interchangeable. Specifically, the first chip 410 and the second chip 420 can be first joined to each other, and then the unity of the first chip 410 and the second chip 420 can be disposed onto the substrate 430.

Second, as shown in FIG. 12, the wire bonding process and the encapsulating process can be performed in other sequences. For example, the process for fabricating the chip package can be performed by first wirebonding the first wires 450, next forming the first molding compound 470, next wirebonding the second wires 460, and then foaming the second molding compound 480. Alternatively, the process for fabricating the chip package can be performed by first wirebonding the second wires 460, next forming the second molding compound 480, next wirebonding the first wires 450, and then forming the first molding compound 470. Alternatively, the process for fabricating the chip package can be performed by first wirebonding the first wires 450 and the second wires 460, and then forming the first molding compound 470 and the second molding compound 480.

Figure 13:
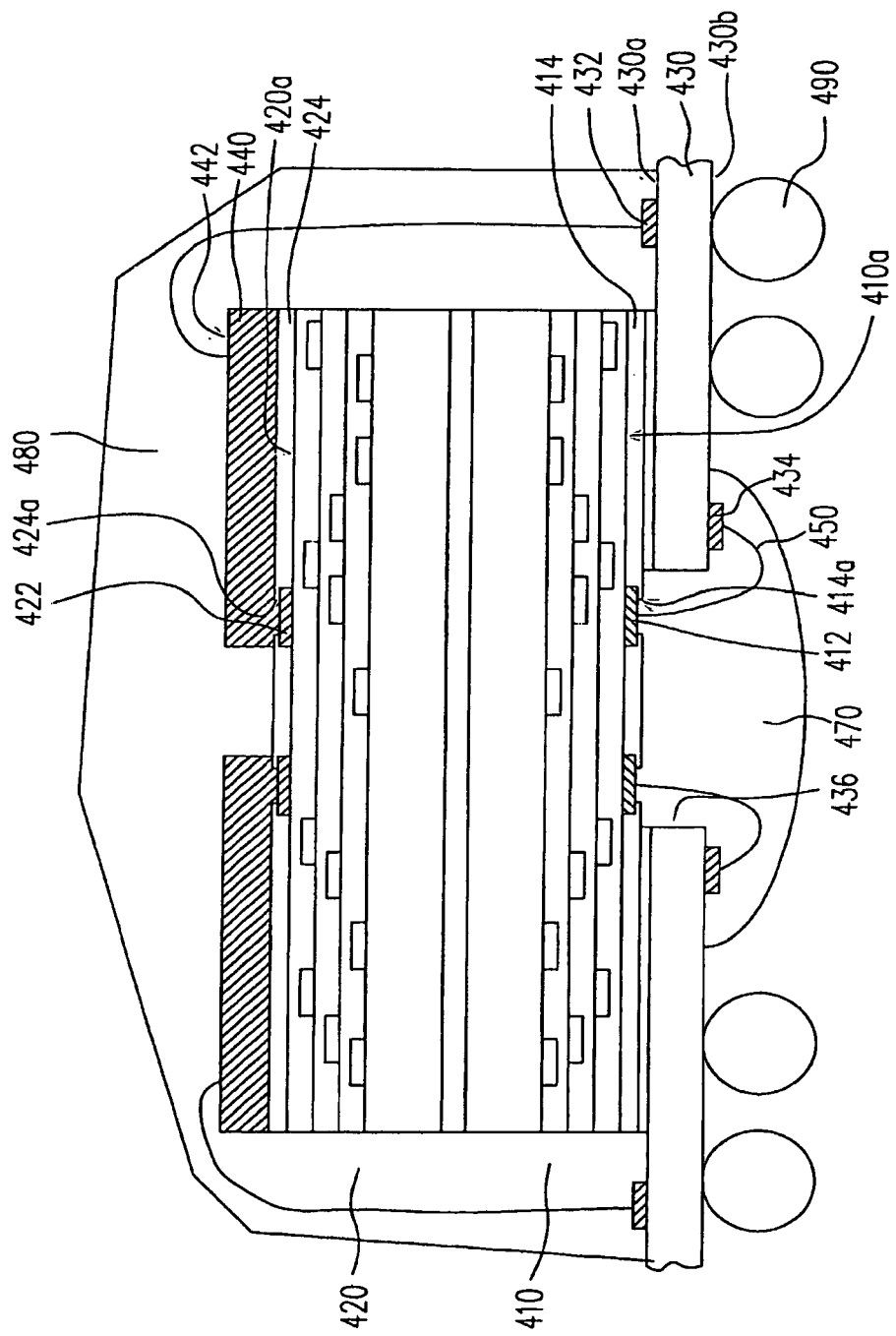
FIG. 13 shows a schematic view of a stacked chip package structure according to a second embodiment.

FIG. 13 shows a schematic view of a stacked chip package structure according to a second embodiment. The reference number in FIG. 13 indicates the same part or the like as those indicated by the same reference number in FIGS. 9-12. The description of the arrangement of the substrate 430, the first and second semiconductor chips 410 and 420, the first and second wires 450 and 460 formed by a wire bonding process, and the first and second molding compound 470 and 480 can be referred to the above illustration.

As shown in FIG. 13, the stacked chip package structure 400 may include the first semiconductor chip 410, the second semiconductor chip 420, the substrate 430, the second redistribution lines 440, the first and second wires 450 and 460 formed by a wirebonding process, the first and second molding compound 470 and 480, and the solder ball 490. The first semiconductor chip 410 and the second semiconductor chip 420 stacked back to back are disposed on the substrate 430. The second redistribution lines 440 are disposed on the second passivation layer 424 of the second semiconductor chip 420 and provide multiple second redistribution pads 442 that are located in the peripheral region of the second semiconductor chip 420 and electrically connected to the substrate pads 432 through the second wires 460 formed by a wirebonding process, and thereby the second wires 460 may have a reduced length. Multiple solder balls 490 are disposed on the bottom surface 430b of the substrate 430 and used for the electrical connection of the first chip 410 and the second chip 420 to an external circuit. The material of the solder balls 490 can be an alloy of tin and lead or an alloy of tin, silver and cooper.

It should be noted that the first and second passivation layers 414 and 424 may have a same material or structure as those of the first and second passivation layers 314 and 324 as described in the first embodiment. The second redistribution lines 440 may have a same material or structure as those of the first redistribution lines 340 as described in the first embodiment. The substrate 430 may have a same material or structure as those of the substrate 330 as described in the first embodiment.

Third Embodiment

According to the above mentioned first and second embodiments, the first semiconductor chip and the second semiconductor chip have a same circuitry layout under the passivation layer. The first chip pads and the second chip pads that are in same positions have same electrical functions. However, in other embodiments of the present invention, the first semiconductor chip and the second semiconductor chip may have different circuitry layouts.

Figure 14:
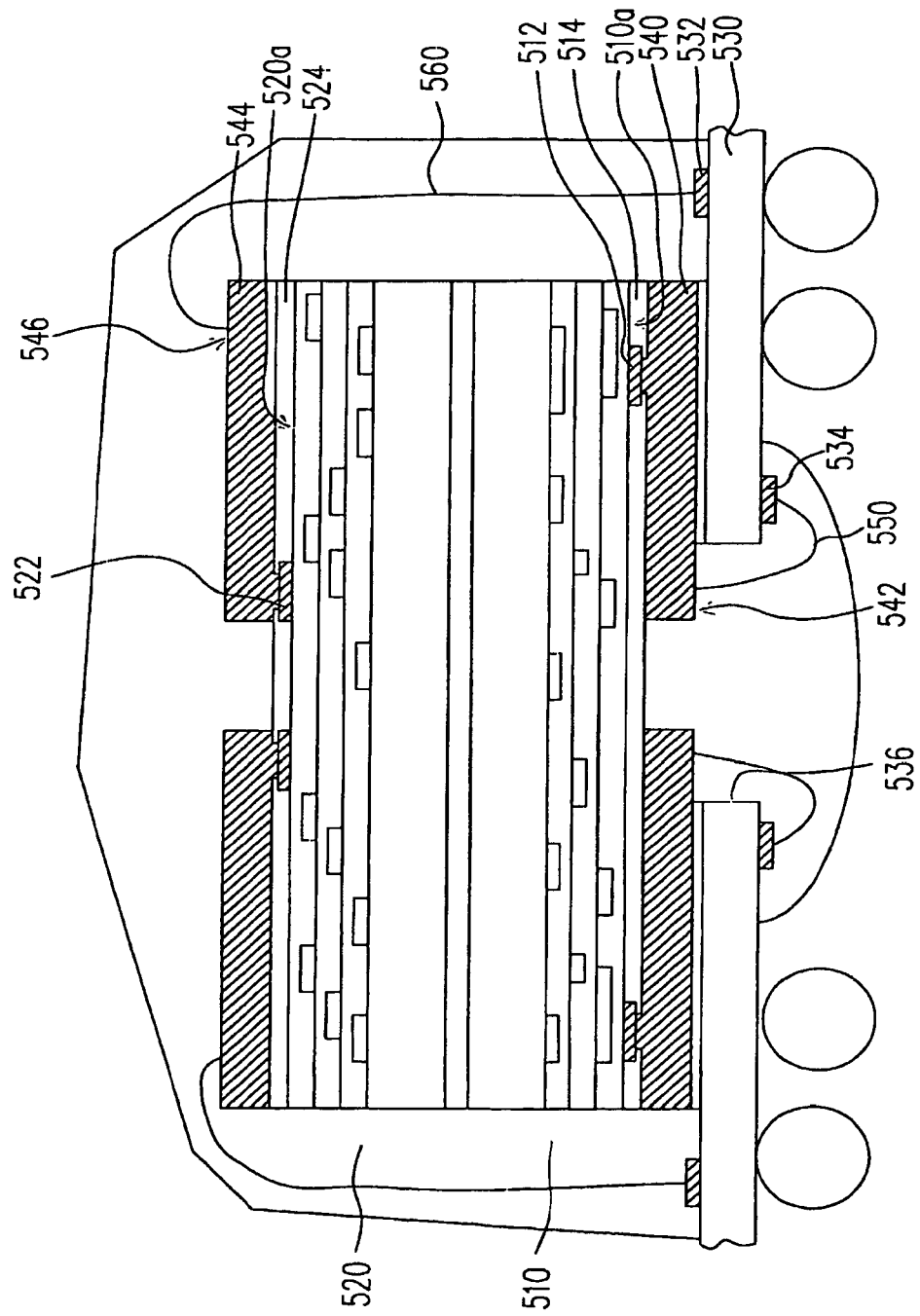
FIG. 14 is a cross-sectional view of a stacked chip package according to a third embodiment.

FIG. 14 is a cross-sectional view of a stacked chip package according to a third embodiment. As shown in FIG. 14, multiple first chip pads 512 of a first semiconductor chip 510 exposed by multiple openings in a first passivation layer 514 are disposed in the peripheral region of the first semiconductor chip 510 and are blocked by a substrate 530. Multiple second chip pads 522 of a second semiconductor chip 520 exposed by multiple openings in a second passivation layer 524 are disposed in the central region of the second semiconductor chip 520. In this embodiment, the first redistribution lines 540 are located on the first passivation layer 514 of the first semiconductor chip 510. The first redistribution lines 540 are electrically connected to the first chip pads 512. Multiple first redistribution pads 542 of the first redistribution lines 540 are located in the central region of the first semiconductor chip 510 and exposed through the opening 536 in the substrate 530.

The second redistribution lines 544 are located on the second passivation layer 524 of the second semiconductor chip 520. The second redistribution lines 544 are electrically connected to the second chip pads 522. Multiple second redistribution pads 546 of the second redistribution lines 544 are located in the peripheral region of the second semiconductor chip 520.

Due to the formation of the first and second redistribution lines 540 and 544, multiple first wires 550 formed by a wire bonding process can pass through the opening 536 in the substrate 530 and make an electric connection between the first redistribution pads 542 and the second substrate pads 534. The second wires 560 formed by a wire bonding process can make an electric connection between the second redistribution pads 546 and the first substrate pads 532, and thereby the second wires 560 may have a reduced length.

It should be noted that the first and second passivation layers 514 and 524 may have a same material or structure as those of the first and second passivation layers 314 and 324 as described in the first embodiment. The first and second redistribution lines 540 and 544 may have a same material or structure as those of the first redistribution lines 340 as described in the first embodiment. The substrate 530 may have a same material or structure as those of the substrate 330 as described in the first embodiment.

Fourth Embodiment

Figure 15:
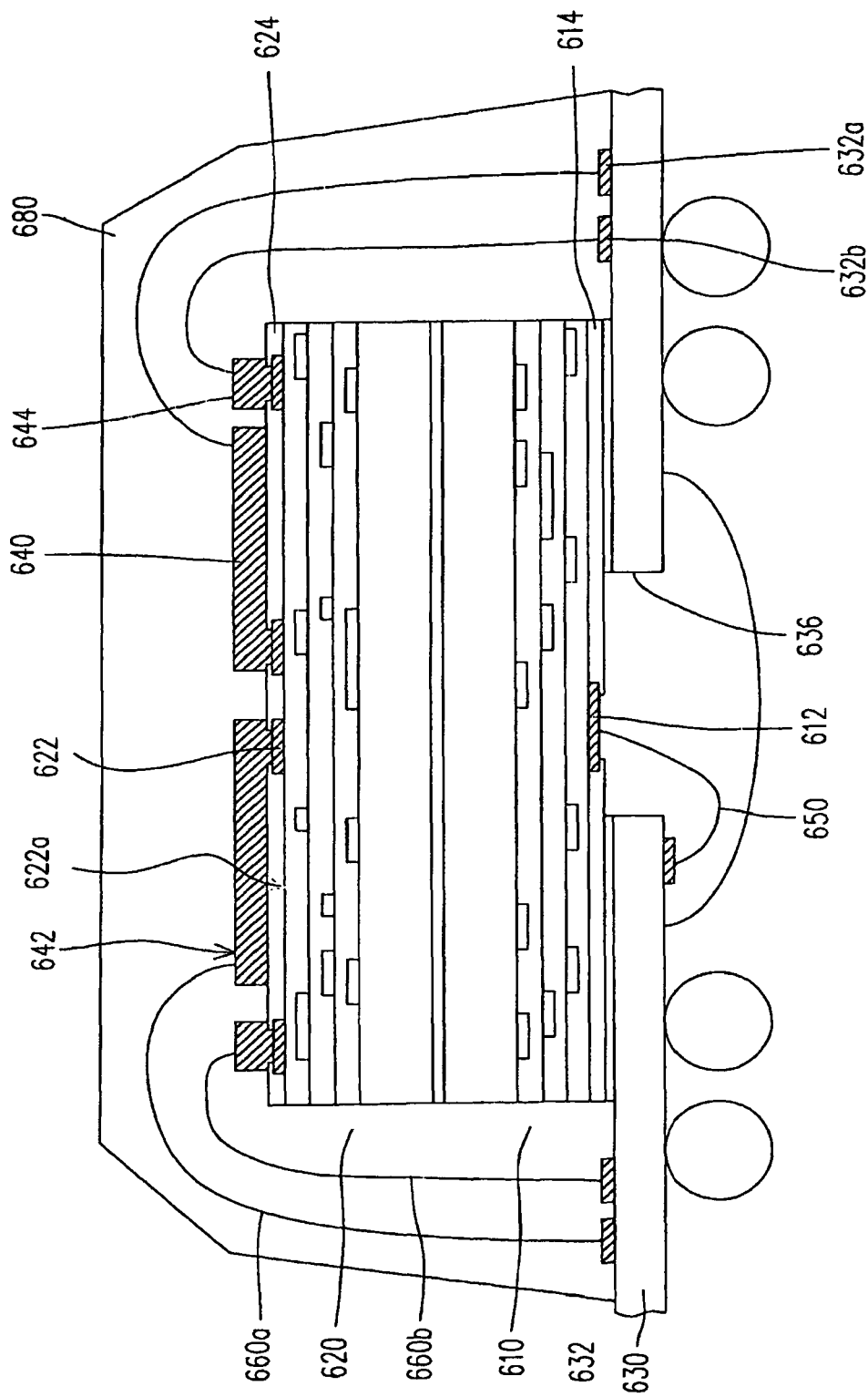
FIG. 15 and FIG. 16 are schematically cross-sectional views of two stacked chip packages according to a fourth embodiment.
Figure 16:
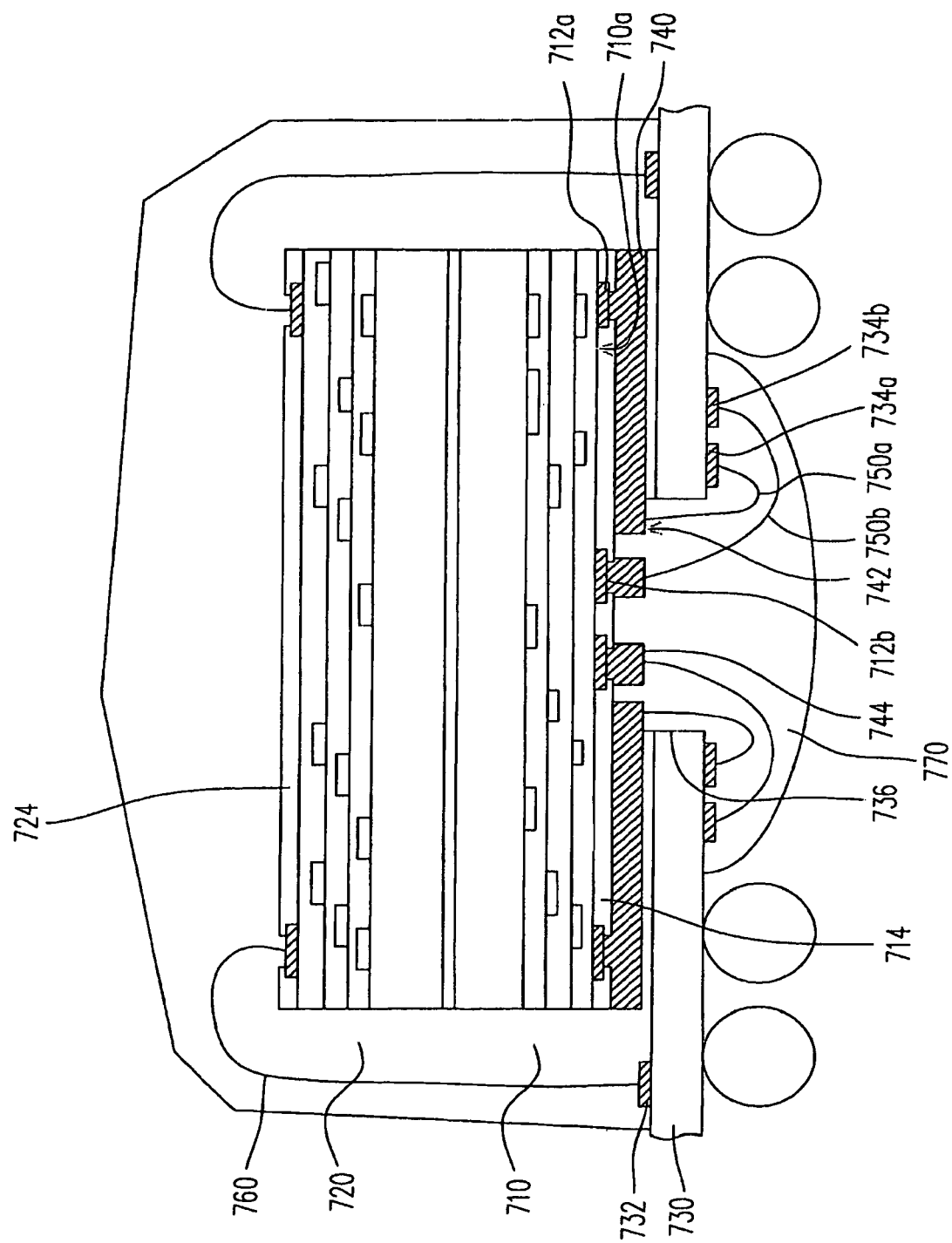

Except for the above mentioned embodiments, the chip pads of the first semiconductor chip and the second semiconductor chip can be partially located in the peripheral region of the first and second semiconductor chips and partially located in the central region of the first and second semiconductor chips. FIG. 15 and FIG. 16 are schematically cross-sectional views of two stacked chip packages according to a fourth embodiment. As shown in FIG. 15, partial second chip pads 622 of a second semiconductor chip 620 exposed by multiple openings in a second passivation layer 624 are located in the central region of the second semiconductor chip 620. Partial second chip pads 622 of a second semiconductor chip 620 exposed by multiple openings in a second passivation layer 624 are located in the peripheral region of the second semiconductor chip 620. A patterned circuit layer is formed on the second passivation layer 624 and on the second chip pads 622 in the central and peripheral regions of the second semiconductor chip 620. The patterned circuit layer includes multiple redistribution lines 640 disposed on the second passivation layer 624 and connected to the second chip pads 622 in the central region of the second semiconductor chip 620. The redistribution lines 640 include multiple redistribution pads 642 in the peripheral region of the second semiconductor chip 620, wherein the redistribution pads 642 are connected to the second chip pads 622 in the central region of the second semiconductor chip 620. The patterned circuit layer includes multiple metal pads 644 on the second chip pads 622 in the peripheral region of the second semiconductor chip 620. Multiple second wires 660a and 660b formed by a wirebonding process connect the metal pads 642 and 644 of the patterned circuit layer to multiple metal pads 632a and 632b on a top surface of a substrate 630. The second wires 660a are over the second wires 660b. The second wires 660a and 660b are enclosed by a molding compound 680. The first chip pads 612 exposed by multiple openings in a first passivation layer 614 of the first semiconductor chip 610 is provided in a central region of the first semiconductor chip 610. Multiple first wires 650 formed by a wirebonding process may be connected to the first chip pads 612 through an opening 636 in a substrate 630.

It should be noted that the first and second passivation layers 614 and 624 may have a same material or structure as those of the first and second passivation layers 314 and 324 as described in the first embodiment. The patterned circuit layer including the redistribution lines 640 and the metal pads 644 may have a same material or structure as those of the first redistribution lines 340 as described in the first embodiment. The substrate 630 may have a same material or structure as those of the substrate 330 as described in the first embodiment. Other similar structures not mentioned above but shown in FIG. 15 may be as referred to those illustrated in the above first, second and third embodiments.

As shown in FIG. 16, Partial first chip pads 712 of a first semiconductor chip 710 exposed by multiple openings in a first passivation layer 714 are located in the peripheral region of the first semiconductor chip 710. Partial first chip pads 712 of a first semiconductor chip 710 exposed by multiple openings in a first passivation layer 714 are located in the central region of the first semiconductor chip 710. A patterned circuit layer is formed on the first passivation layer 714 and on the first chip pads 712a and 712b in the central and peripheral regions of the first semiconductor chip 710. The patterned circuit layer includes multiple redistribution lines 740 disposed on the first passivation layer 714 and connected to the first chip pads 712a in the peripheral region of the first semiconductor chip 710. The redistribution lines 740 provide multiple redistribution pads 742 in the central region of the first semiconductor chip 710, wherein the redistribution pads 742 are connected to the first chip pads 712a in the peripheral region of the first semiconductor chip 710. The patterned circuit layer includes multiple metal pads 744 on the first chip pads 712b in the central region of the first semiconductor chip 710. Multiple first wires 750a and 750b formed by a wirebonding process connect the metal pads 742 and 744 of the patterned circuit layer to multiple metal pads 734a and 734b on a bottom surface of a substrate 730 through an opening 736 in the substrate 730. The first wires 750b are over the first wires 750a. The first wires 750a and 750b are enclosed by a molding compound 770. Multiple second chip pads 722 exposed by multiple openings in a second passivation layer 724 of a second semiconductor chip 720 is provided in a peripheral region of the second semiconductor chip 720. Multiple second wires 760 formed by a wirebonding process may connect the second chip pads 722 to a metal pad 732 on a top surface of the substrate 730.

It should be noted that the first and second passivation layers 714 and 724 may have a same material or structure as those of the first and second passivation layers 314 and 324 as described in the first embodiment. The patterned circuit layer including the redistribution lines 740 and the metal pads 744 may have a same material or structure as those of the first redistribution lines 340 as described in the first embodiment. The substrate 730 may have a same material or structure as those of the substrate 330 as described in the first embodiment. Other similar structures not mentioned above but shown in FIG. 16 may be as referred to those illustrated in the above first, second and third embodiments.

To sum up, the stacked chip package and the process for forming the same employ multiple redistribution lines formed on the upper or lower semiconductor chip to change the positions of the metal pads used to be wirebonded thereto. Therefore, multiple chip pads of the lower semiconductor chip used to be wirebonded thereto cannot be blocked by the substrate. If the chip pads of the upper semiconductor chip are too far from the edge of the upper semiconductor chip, multiple redistribution lines can be formed over the upper semiconductor chip to form multiple metal pads used to be wirebonded thereto close to an edge of the upper semiconductor chip, thereby the wires formed by a wirebonding process and connected to the redistributed metal pads may have reduce lengths.

Figure 17A:
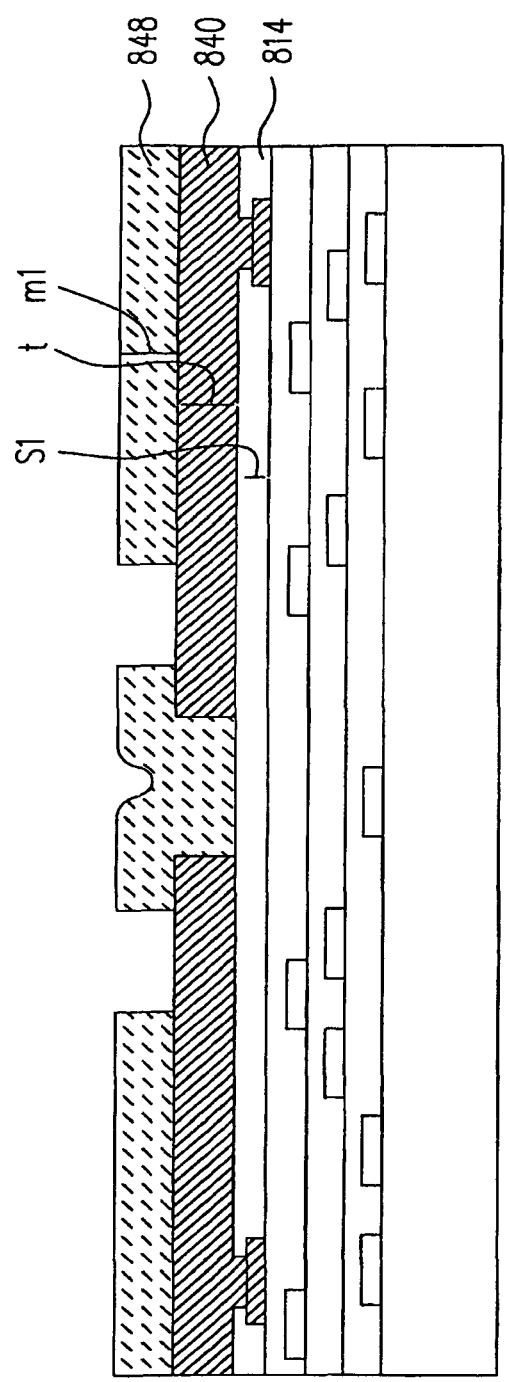
FIG. 17A through the FIG. 17D are enlarged views showing a semiconductor chip with a polymer layer.

It is remarkable that in the stacked chip package of the present invention, at lease one polymer layer can be optionally formed over the first passivation layer of the first semiconductor chip and/or over the second passivation layer of the second semiconductor chip as disclosed in the above mentioned embodiments. FIG. 17A through the FIG. 17D are enlarged views showing a semiconductor chip with a polymer layer. The structure below mentioned in FIG. 17A through FIG. 17D can be applied to the above mentioned first semiconductor chip and/or the second semiconductor chip.

As shown in FIG. 17A, there is a polymer layer 848 disposed on the redistribution lines 840. The material of the polymer layer 848 can be polyimide (PI), benzo-cyclo-butene (BCB), parylene, epoxy or elastomer. The polymer layer 848 may be a solid structure or a porous structure. The thickness m1 of the polymer layer 848 ranges from 1 to 20 microns. The thickness t of the redistribution lines 840 ranges from 1 to 20 microns. The thickness s1 of the passivation layer 814 ranges from 0.3 and 1 microns. The passivation layer 814 is typically constructed of inorganic compounds, such as silicon nitride, silicon oxide, phosphosilicate glass (PSG), or a composite of the above-mentioned materials. The redistribution lines 840 may have a same material or structure as those of the first redistribution lines 340 as described in the first embodiment.

Figure 17B:
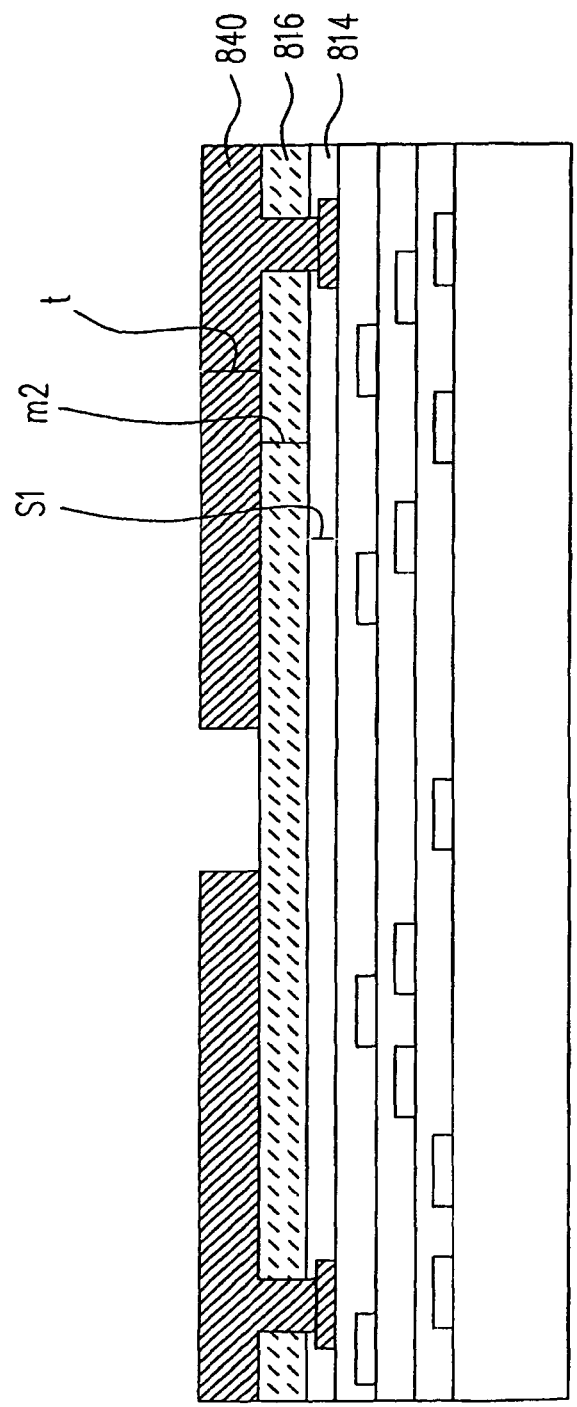

As shown in FIG. 17B, a polymer layer 816 can be formed between the redistribution lines 840 and the passivation layer 814. The material of the polymer layer 816 can be polyimide (PI), benzo-cyclo-butene (BCB), parylene, epoxy or elastomer. The polymer layer 816 may be a solid structure or a porous structure. The thickness m2 of the polymer layer 816 ranges from 1 microns to 20 microns. The thickness t of the redistribution lines 840 ranges from 1 microns to 20 microns. The thickness s1 of the passivation layer 814 ranges from 0.3 and 1 microns. The passivation layer 814 is typically constructed of inorganic compounds, such as silicon nitride, silicon oxide, phosphosilicate glass (PSG), or a composite of the above mentioned materials. The redistribution lines 840 may have a same material or structure as those of the first redistribution lines 340 as described in the first embodiment.

Figure 17C:
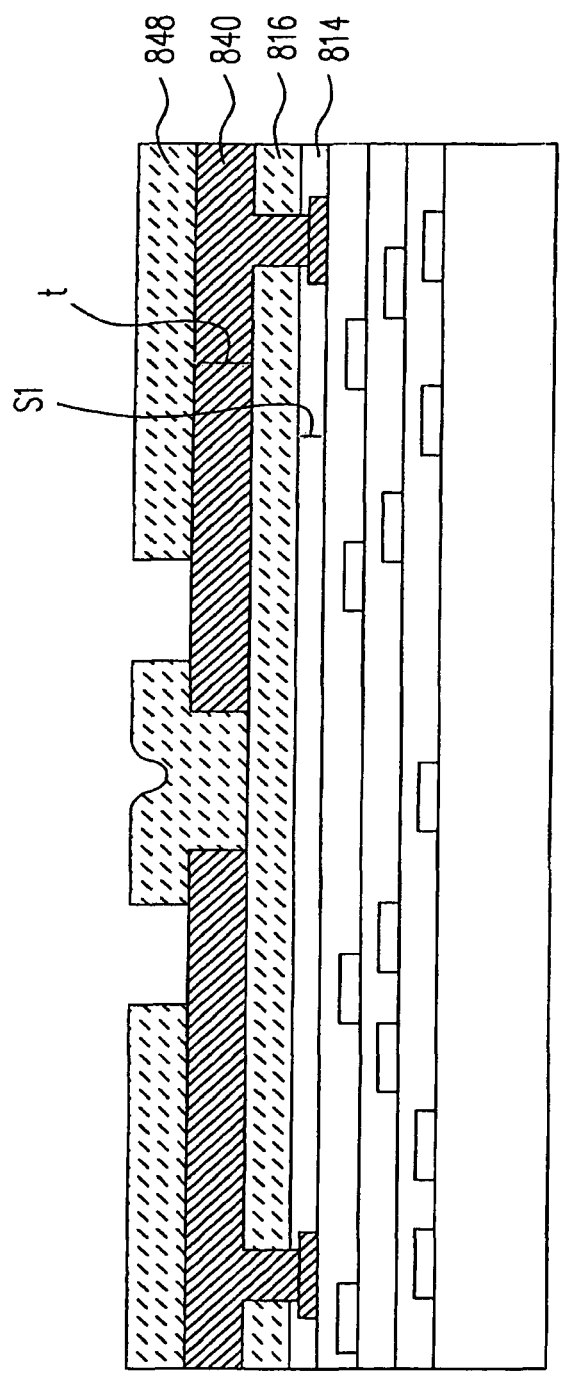
Figure 17D:
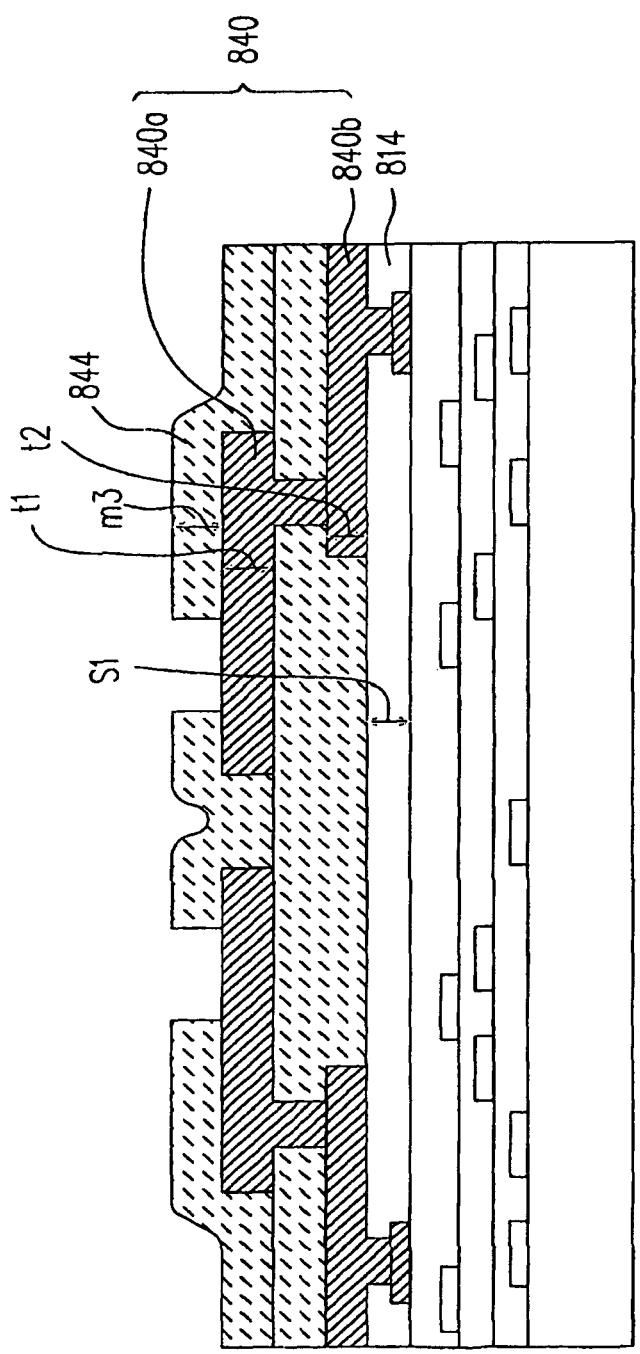

As shown in FIG. 17C, Multiple polymer layers 848 and 816 can be disposed on the redistribution lines 840 and between the redistribution lines 840 and the passivation layer 814, respectively. The material and the thickness of the polymer layers 848 and 816 are the same as those having same reference numbers above mentioned in FIG. 17A and FIG. 17B. The thickness t of the redistribution lines 840 ranges from 1 to 20 microns. The thickness s1 of the passivation layer 814 ranges from 0.3 to 1 microns. The passivation layer 814 is typically constructed of inorganic compounds, such as silicon nitride, silicon oxide, phosphosilicate glass (PSG), or a composite of the above mentioned materials. The redistribution lines 840 may have a same material or structure as those of the first redistribution lines 340 as described in the first embodiment.

In case that the redistribution lines 840 are constructed from multiple patterned circuit layers, the above mentioned polymer layer can be disposed between the patterned circuit layers. As shown in FIG. 17D, the redistribution lines 840 are made from a first patterned circuit layer 840a and a second patterned circuit layer 840b. A polymer layer 844 is disposed on the first patterned circuit layer 840a and its material can be polyimide (PI), benzo-cyclo-butene (BCB), parylene, epoxy or elastomer. The polymer layer 844 can be a solid structure or a porous structure. The thickness m3 of the polymer layer 844 ranges from 1 to 20 microns. The thickness t1 of the patterned circuit layer 840a and the thickness t2 of the second patterned circuit layer range from 1 to 20 microns. The thickness s1 of the passivation layer 814 ranges from 0.3 to 1 microns. The passivation layer is typically constructed of inorganic compounds, such as silicon nitride, silicon oxide, phosphosilicate glass (PSG), or a composite of the above mentioned materials. Alternatively, a polymer layer can be deposited between the first patterned circuit layer 840a and the passivation layer 814. The redistribution lines 840a and 840b may have a same material or structure as those of the first redistribution lines 340 as described in the first embodiment.

In the stacked chip package of the prevent invention, a polymer layer can be disposed between the passivation layer and the redistribution lines, over the redistribution lines, or between the multiple patterned circuit layers of the redistribution lines. The distribution lines can be constructed from single or multiple patterned circuit layers. Various materials can be employed to the redistribution lines.

To sum up, the stacked chip package and the process for forming the same have at least following advantages:

a. The length of the wires formed by a wirebonding process can be reduced, and thereby a better electric performance of transmitting signals through the wires can be achieved.

b. The chip pads blocked by the substrate can be avoided and it is not needed to redesign the circuit layout under a passivation layer on a semiconductor chip. As a result, the process of forming the semiconductor chip can be simplified.

c. Multiple semiconductor chips with a same circuit layout under passivation layers thereof can be integrated in an electronic package. It is contributive to reduce the production costs and enhance the manufacture efficiency.

It will be apparent to those skilled in the art that various modifications and variations can be made to the structure of the present invention without departing from the scope or spirit of the invention. Therefore, the protection area of the present invention depends on the claims attached in the patent application.

What is claimed is:

1. A chip package comprising:
   a glass substrate;
   multiple solder balls under said glass substrate;
   a first pad under said glass substrate;
   a first chip over said glass substrate;
   a first interconnect passing through an opening in said glass substrate and connecting said first chip to said first pad;
   a second interconnect connected to said first chip and disposed over said glass substrate, wherein said second interconnect is connected to said first pad through said first interconnect; and
   a second chip over said first chip and said glass substrate.

2. The chip package of claim 1 further comprising a second pad over said glass substrate and a second interconnect connecting said second chip to said second pad.

3. The chip package of claim 2, wherein said second interconnect comprises a wirebonded wire.

4. The chip package of claim 1 wherein said first chip comprises a second pad having a bottom surface connected to said first interconnect.

5. The chip package of claim 1, wherein said second interconnect comprises a copper layer.

6. The chip package of claim 1, wherein said second interconnect comprises a gold layer.

7. The chip package of claim 1, wherein said second interconnect comprises a nickel layer.

8. The chip package of claim 1, wherein said second interconnect comprises an aluminum layer.

9. The chip package of claim 1, wherein said second chip joins said first chip.

10. The chip package of claim 1, further comprising a polymer portion over said glass substrate and said first and second chips, wherein said polymer portion covers a sidewall of said first chip and a sidewall of said second chip.

11. The chip package of claim 1 further comprising a polymer portion in said opening, wherein said polymer portion encloses said first interconnect.

12. A chip package comprising:
   a glass substrate;
   multiple solder balls under said glass substrate;
   a first pad under said glass substrate;
   a first chip over said glass substrate, wherein said first chip comprises a passivation layer comprising a nitride, a second pad having a contact point at a top of a first opening in said passivation layer, and a first interconnect over said glass substrate, wherein said first interconnect is connected to said contact point through said first opening, wherein said first interconnect comprises a copper layer having a thickness between 1 and 30 micrometers; and
   a second interconnect passing through a second opening in said glass substrate and connecting said first interconnect to said first pad, wherein said contact point is connected to said first pad through, in sequence, said first interconnect and said second interconnect.

13. The chip package of claim 12 further comprising a second chip over said first chip and said glass substrate.

14. The chip package of claim 13 further comprising a third pad over said glass substrate and a third interconnect connecting said second chip to said third pad.

15. The chip package of claim 14, wherein said third interconnect comprises a wirebonded wire.

16. The chip package of claim 13, wherein said second chip joins said first chip.

17. The chip package of claim 12 further comprising a polymer portion over said glass substrate and said first chip, wherein said polymer portion covers a sidewall of said first chip.

18. The chip package of claim 12 further comprising a polymer portion in said opening, wherein said polymer portion encloses said second interconnect.

19. A chip package comprising:
   a glass substrate;
   multiple solder balls under said glass substrate;
   a first pad under said glass substrate;
   a first chip over said glass substrate, wherein said first chip comprises a passivation layer comprising a nitride, a second pad having a contact point at a top of a first opening in said passivation layer, and a first interconnect over said glass substrate, wherein said first interconnect is connected to said contact point through said first opening, wherein said first interconnect comprises a gold layer; and
   a second interconnect passing through a second opening in said glass substrate and connecting said first interconnect to said first pad, wherein said contact point is connected to said first pad through, in sequence, said first interconnect and said second interconnect.

20. The chip package of claim 19 further comprising a second chip over said first chip and said glass substrate.

21. The chip package of claim 20 further comprising a third pad over said glass substrate and a third interconnect connecting said second chip to said third pad.

22. The chip package of claim 21, wherein said third interconnect comprises a wirebonded wire.

23. The chip package of claim 20, wherein said second chip joins said first chip.

24. The chip package of claim 19 further comprising a polymer portion over said glass substrate and said first chip, wherein said polymer portion covers a sidewall of said first chip.

25. The chip package of claim 19 further comprising a polymer portion in said opening, wherein said polymer portion encloses said second interconnect.

26. The chip package of claim 19, wherein said gold layer has a thickness between 1 and 15 micrometers.

* * * * *